United States Patent
Tomuro et al.

(10) Patent No.: US 10,820,400 B2
(45) Date of Patent: Oct. 27, 2020

(54) EXTREME ULTRAVIOLET LIGHT GENERATION APPARATUS

(71) Applicant: Gigaphoton Inc., Tochigi (JP)

(72) Inventors: Hiroaki Tomuro, Tochigi (JP); Shinji Nagai, Tochigi (JP); Yoshiyuki Honda, Tochigi (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/677,882

(22) Filed: Nov. 8, 2019

(65) Prior Publication Data

US 2020/0077501 A1   Mar. 5, 2020

Related U.S. Application Data

(63) Continuation of application No. PCT/JP2017/023455, filed on Jun. 26, 2017.

(51) Int. Cl.
*H05G 2/00* (2006.01)
*G02B 5/08* (2006.01)
(Continued)

(52) U.S. Cl.
CPC ......... *H05G 2/008* (2013.01); *G03F 7/70033* (2013.01); *G03F 7/70175* (2013.01)

(58) Field of Classification Search
CPC ...... H05G 2/008; H05G 2/00; G03F 7/70033; G03F 7/70175; G03F 7/20; G02B 5/08
(Continued)

(56) References Cited

U.S. PATENT DOCUMENTS 8,288,743 B2 * 10/2012 Ueno .................. G03F 7/70858
250/504 R
10,136,510 B2 * 11/2018 Nagai ................. G03F 7/70916
(Continued)

FOREIGN PATENT DOCUMENTS

JP   2006-332153 A   12/2006
JP   2014-514741 A    6/2014
(Continued)

OTHER PUBLICATIONS

International Search Report issued in PCT/JP2017/023455; dated Sep. 19, 2017.
(Continued)

*Primary Examiner* — Nicole M Ippolito
(74) *Attorney, Agent, or Firm* — Studebaker & Brackett PC

(57) ABSTRACT

An extreme ultraviolet light generation apparatus includes: a chamber in which plasma is generated from a target substance at a condensation position of a laser beam; a condenser mirror configured to condense extreme ultraviolet light generated by the plasma; and a magnetic field generation unit configured to generate a magnetic field that converges a charged particle generated by the plasma toward a wall of the chamber, the condenser mirror includes a substrate, a reflective layer, and a protective layer provided on the reflective layer, the protective layer has layer thickness distribution in which a layer thickness of the protective layer from a reflective layer surface changes, and the layer thickness of the protective layer is maximum at a position on a line (CL) on which a plane passing through a magnetic field axis of the magnetic field generation unit and a central axis (CA) of the condenser mirror intersects the reflective layer surface (62F).

18 Claims, 17 Drawing Sheets

(51) Int. Cl.
*G03F 7/00* (2006.01)
*G03F 7/20* (2006.01)

(58) Field of Classification Search
USPC .............................. 250/493.1, 494.1, 504 R
See application file for complete search history.

(56) References Cited

U.S. PATENT DOCUMENTS

| | | |
|---|---|---|
| 2006/0270226 A1 | 11/2006 | Hosoya |
| 2014/0022525 A1 | 1/2014 | Enkisch et al. |
| 2015/0079501 A1 | 3/2015 | Shoki et al. |
| 2016/0330826 A1* | 11/2016 | Niimi .................... H05G 2/003 |
| 2016/0377984 A1 | 12/2016 | Enkisch |

FOREIGN PATENT DOCUMENTS

| | | |
|---|---|---|
| JP | 2017-509920 A | 4/2017 |
| WO | 2013/146488 A1 | 10/2013 |

OTHER PUBLICATIONS

Written Opinion issued in PCT/JP2017/023455; dated Sep. 19, 2017.

* cited by examiner

EXTREME ULTRAVIOLET LIGHT GENERATION APPARATUS

CROSS-REFERENCE TO RELATED APPLICATIONS

The present application is a continuation application of International Application No. PCT/JP2017/023455 filed on Jun. 26, 2017. The content of the application is incorporated herein by reference in its entirety.

BACKGROUND

1. Technical Field

The present disclosure relates to an extreme ultraviolet light generation apparatus.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure device including an extreme ultraviolet light generation device configured to generate extreme ultraviolet (EUV) light at a wavelength of 13 nm approximately in combination with reduced projection reflective optics.

Disclosed EUV light generation devices include the three kinds of devices of a laser produced plasma (LPP) device that uses plasma generated by irradiating a target substance with a laser beam, a discharge produced plasma (DPP) device that uses plasma generated by electrical discharge, and a synchrotron radiation (SR) device that uses synchrotron radiation.

LIST OF DOCUMENTS

Patent Document

Patent Document 1: International Patent Publication No. 2013/146488

SUMMARY

An extreme ultraviolet light generation apparatus according to an aspect of the present disclosure includes: a chamber in which a laser beam is condensed to an internal space and plasma is generated from a target substance at a condensation position of the laser beam; a condenser mirror configured to condense extreme ultraviolet light generated by the plasma of the target substance; and a magnetic field generation unit configured to generate a magnetic field that converges a charged particle generated by the plasma of the target substance toward a wall of the chamber. The condenser mirror includes a substrate, a reflective layer provided on the substrate and configured to reflect the extreme ultraviolet light, and a protective layer provided on the reflective layer. The protective layer has layer thickness distribution in which a layer thickness of the protective layer from a reflective layer surface changes. The layer thickness of the protective layer is maximum at a position on a line on which a plane passing through a magnetic field axis of the magnetic field generation unit and a central axis of the condenser mirror intersects the reflective layer surface.

BRIEF DESCRIPTION OF THE DRAWINGS

Embodiments of the present disclosure will be described below as simple examples with reference to the accompanying drawings.

DESCRIPTION OF EMBODIMENTS

1. Overview
2. Extreme ultraviolet light generation apparatus
2.1 Entire configuration
2.2 Operation 3. EUV light condenser mirror of comparative example
3.1 Configuration
3.2 Problem
4. EUV light condenser mirror of Embodiment 1
4.1 Configuration
4.2 Effect
5. EUV light condenser mirror of Embodiment 2
5.1 Configuration
5.2 Effect
6. EUV light condenser mirror of Embodiment 3
6.1 Configuration
6.2 Effect
7. EUV light condenser mirror of Embodiment 4
7.1 Configuration
7.2 Effect
8. EUV light condenser mirror of Embodiment 5
8.1 Configuration
8.2 Effect
9. EUV light condenser mirror of Embodiment 6
9.1 Configuration
9.2 Effect
10. EUV light condenser mirror of Embodiment 7
10.1 Configuration
10.2 Effect Embodiments of the present disclosure will be described below in detail with reference to the accompanying drawings.

The embodiments described below are examples of the present disclosure, and do not limit the contents of the present disclosure. Not all configurations and operations described in each embodiment are necessarily essential as configurations and operations of the present disclosure.

Components identical to each other are denoted by an identical reference sign, and duplicate description thereof will be omitted.

1. Overview

Embodiments of the present disclosure relate to an extreme ultraviolet light generation apparatus configured to generate light having a wavelength called extreme ultraviolet (EUV). Extreme ultraviolet light is also referred to as EUV light.

2. Extreme Ultraviolet Light Generation Apparatus 2.1 Entire Configuration

Figure 1:
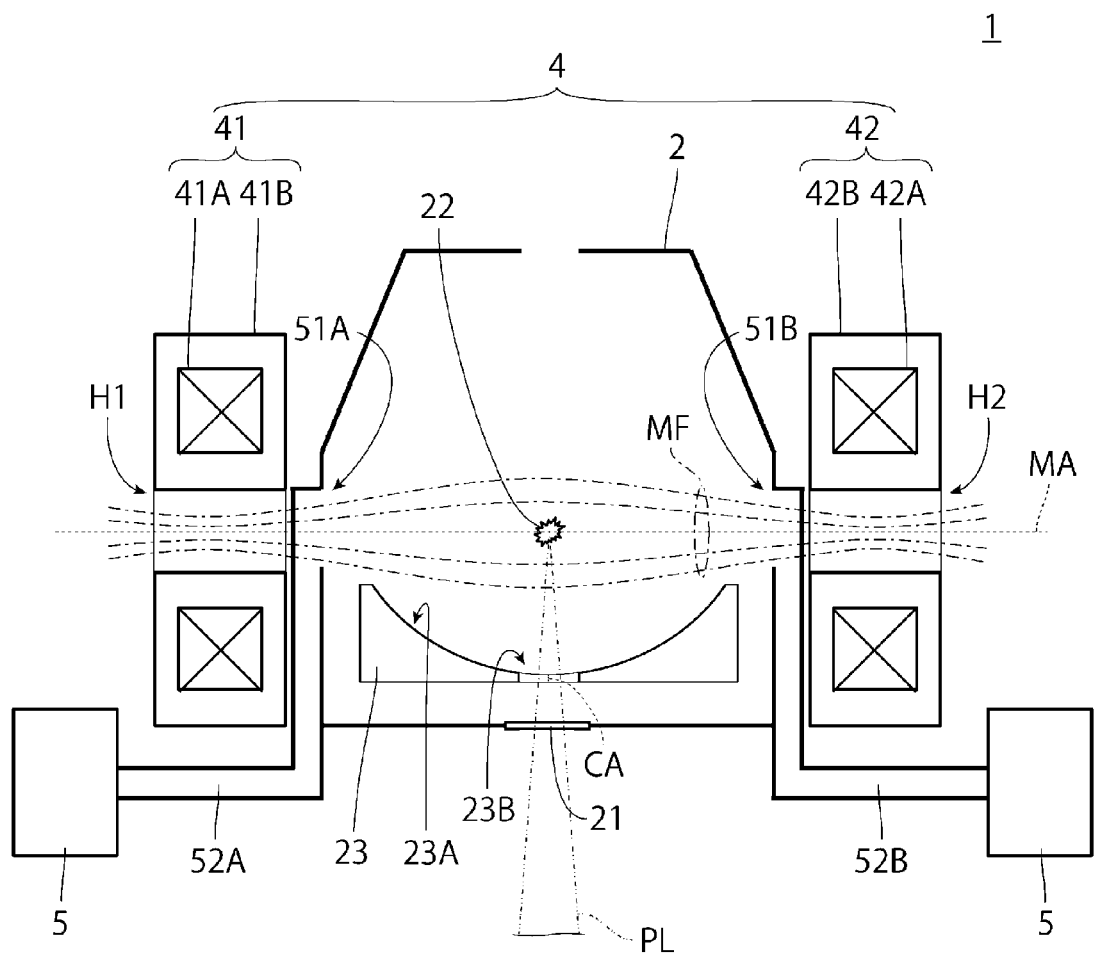
FIG. 1 is a pattern diagram illustrating an exemplary entire schematic configuration of an extreme ultraviolet light generation apparatus.

FIG. 1 is a pattern diagram illustrating an exemplary entire schematic configuration of an extreme ultraviolet light generation apparatus. As illustrated in FIG. 1, an extreme ultraviolet light generation apparatus 1 according to the present embodiment includes a chamber 2 and a droplet supply unit (not illustrated). The chamber 2 is a sealable container that can be depressurized. The droplet supply unit supplies a droplet of a target substance into the chamber 2. For example, the droplet supply unit supplies droplets of the target substance into the chamber 2 at intervals by a continuous jet scheme. The material of the target substance may contain tin, terbium, gadolinium, lithium, xenon, or a combination of two or more thereof, but is not limited thereto.

The wall of the chamber 2 is provided with at least one through-hole blocked by a window 21. A laser beam PL in pulses is incident in an internal space of the chamber 2 through the window 21, and a plasma generation region 22 inside the chamber 2 is irradiated with the incident laser beam PL. The plasma generation region 22 is a region in which plasma is generated from a droplet of the target substance supplied into the chamber 2.

An EUV light condenser mirror 23 is provided inside the chamber 2. The EUV light condenser mirror 23 condenses EUV light generated from plasma of a droplet in the plasma generation region 22. For example, the EUV light condenser mirror 23 includes a reflective surface 23A having a spheroid shape that reflects the EUV light generated in the plasma generation region 22, and is disposed to have a first focal point positioned in the plasma generation region 22 and a second focal point positioned at an intermediate focus point. The EUV light condenser mirror 23 may have a through-hole 23B about a central axis CA of the EUV light condenser mirror 23 so that the laser beam PL incident inside the chamber 2 passes through the through-hole 23B. The EUV light condenser mirror 23 may be provided with a temperature adjuster configured to maintain the temperature of the EUV light condenser mirror 23 substantially constant. The central axis CA of the EUV light condenser mirror 23 may be a straight line passing through the first and second focal points of the reflective surface 23A, or may be the rotational axis of the spheroidal surface.

The extreme ultraviolet light generation apparatus 1 of the present embodiment also includes a magnetic field generation unit 4. The magnetic field generation unit 4 generates a magnetic field MF that converges a charged particle generated in the plasma generation region 22 toward the wall of the chamber 2.

The magnetic field generation unit 4 may be achieved by, for example, a pair of electromagnets 41 and 42 disposed to sandwich facing walls of the chamber 2. The electromagnet 41 includes a superconductive coil 41A, a case 41B enclosing the superconductive coil 41A, and a current supply unit (not illustrated) connected with the superconductive coil 41A. The electromagnet 42 includes a superconductive coil 42A, a case 42B enclosing the superconductive coil 42A, and a current supply unit (not illustrated) connected with the superconductive coil 42A.

The pair of superconductive coils 41A and 42A are disposed so that the plasma generation region 22 is positioned at the middle of the superconductive coils 41A and 42A. The direction of current supplied from the current supply unit to the superconductive coil 41A is the same as the direction of current supplied from the current supply unit to the superconductive coil 42A. When such current is supplied to the superconductive coils 41A and 42A, the magnetic field MF having a magnetic flux density that is highest near the superconductive coils 41A and 42A and lower at a position closer to the plasma generation region 22 is generated. The magnetic field MF is also referred to as a mirror magnetic field. The superconductive coils 41A and 42A may be circular coils and may be disposed so that the coil axes of their coils are aligned with each other. In the following description, a straight line passing through the coil axes of the respective coils is a magnetic field axis MA of the magnetic field generation unit 4. However, when a central axis can be defined for the magnetic field MF generated inside the chamber 2, this central axis may be the magnetic field axis MA of the magnetic field generation unit 4.

It is preferable to reduce a mirror ratio to efficiently converge charged particles generated in the plasma generation region 22 toward the wall of the chamber 2. The mirror ratio is the ratio of the magnetic flux density near the superconductive coils 41A and 42A relative to the magnetic flux density in the plasma generation region 22 positioned at the middle of the superconductive coils 41A and 42A. In addition, the shape of the magnetic field MF may be controlled to efficiently converge charged particles generated in the plasma generation region 22 toward the wall of the chamber 2. For example, the shape of the magnetic field MF can be controlled by the number of turns of each of the superconductive coils 41A and 42A, the magnitude of the current applied to each of the superconductive coils 41A and 42A, and the like.

The magnetic field generation unit 4 may generate a magnetic field for converging charged particles from the one electromagnet 41 side to the other electromagnet 42 side through the plasma generation region 22. The magnetic field generation unit 4, which is achieved by the pair of electromagnets 41 and 42, may be achieved by a pair of permanent magnets. The electromagnets 41 and 42 or the permanent magnets as magnets for generating a magnetic field may be positioned inside the chamber 2.

The extreme ultraviolet light generation apparatus 1 of the present embodiment includes an etching gas supply unit (not illustrated) and a discharge unit 5. The etching gas supply unit supplies etching gas that reacts with fine particles and charged particles generated from plasma of a droplet. For example, the etching gas supply unit may supply the etching gas along the reflective surface 23A from an outer peripheral part of the EUV light condenser mirror 23. When the material of the target substance is tin, the etching gas is hydrogen-containing gas such as hydrogen gas. In this case, tin fine particles and tin ions are generated from plasma of a droplet of the target substance in the plasma generation region 22, and react with hydrogen to become stannane ($SnH_4$) gas at room temperature.

The discharge unit 5 discharges residual gas in the chamber 2. The residual gas includes fine particles and charged particles generated from plasma in the plasma generation region 22, products generated therefrom through reaction with etching gas, and unreacted etching gas. Some charged particles are neutralized in the chamber 2. The residual gas includes the neutralized charged particles. For example, the discharge unit 5 may acquire the residual gas in the chamber 2 from discharge ports 51A and 51B provided to the wall of the chamber 2 through discharge pipes 52A and 52B coupled with the discharge ports 51A and 51B, and may provide predetermined discharge treatment on the residual gas.

In the example illustrated in FIG. 1, the discharge ports 51A and 51B are provided on the magnetic field axis MA of the magnetic field MF, but may be provided at a different position such as the wall of the chamber 2. However, the discharge ports 51A and 51B are preferably provided on the magnetic field axis MA of the magnetic field MF to efficiently discharge charged particles generated in the plasma generation region 22.

In the example illustrated in FIG. 1, the discharge pipe 52A is disposed passing between the chamber 2 and the electromagnet 41, but may be disposed to penetrate a through-hole H1 of the superconductive coil 41A. Similarly, in the example illustrated in FIG. 1, the discharge pipe 52B is disposed passing between the chamber 2 and the electromagnet 42, but may be disposed to penetrate a through-hole H2 of the superconductive coil 42A. In addition, a trapping mechanism such as a heater configured to trap fine particles may be provided to at least one of the pair of discharge ports 51A and 51B and the discharge unit 5. The discharge unit 5 may maintain the pressure in the chamber 2 substantially constant.

2.2 Operation

The magnetic field generation unit 4 generates the magnetic field MF having a magnetic flux density that is highest near the superconductive coils 41A and 42A and lower at a position closer to the plasma generation region 22, and the discharge unit 5 maintains the pressure in the chamber 2 substantially constant. The magnetic flux density of the magnetic field MF is, for example, 0.4 T to 3 T, preferably 0.5 T to 1.5 T. The pressure in the chamber 2 is, for example, 10 Pa to 100 Pa, preferably 15 Pa to 40 Pa.

In this state, etching gas and a droplet of the target substance are supplied into the chamber 2, and the droplet having reached the plasma generation region 22 in the chamber 2 is irradiated with the laser beam PL.

Plasma is generated from the droplet irradiated with the laser beam PL, and radiates light including EUV light. The EUV light is selectively reflected by the reflective surface 23A of the EUV light condenser mirror 23 and is output to an exposure device (not illustrated) connected with the chamber 2.

As described above, a charged particle is generated from plasma of a droplet. The charged particle receives Lorentz force and moves on a trajectory that rotates in a plane orthogonal to the magnetic field line. When the charged particle moving in this manner has a speed component in a direction toward the discharge ports 51A and 51B, the charged particle converges toward the wall of the chamber 2 while moving on a helical trajectory along the magnetic field line. Then, the charged particle is induced to the discharge ports 51A and 51B provided to the wall of the chamber 2 near a convergence place of the magnetic field MF.

As described above, a fine particle is generated from plasma of a droplet. The fine particle is unlikely to be affected by the magnetic field MF generated by the magnetic field generation unit 4 and thus diffuses in the chamber 2. Some of fine particles diffusing in the chamber 2 react with etching gas supplied along the reflective surface 23A of the EUV light condenser mirror 23, and become certain generated products through the reaction. When the fine particles are tin fine particles and the etching gas is hydrogen-containing gas as described above, such a generated product is stannane gas at room temperature. At high temperature, stannane separates from hydrogen, and tin fine particles are likely to be generated. Thus, when the generated product is stannane, the temperature of the EUV light condenser mirror 23 is preferably maintained at 60° C. or lower to prevent the separation from hydrogen. The temperature of the EUV light condenser mirror 23 is more preferably 20° C. or lower.

Generated products obtained through reaction with etching gas move toward the discharge ports 51A and 51B in the flow of unreacted etching gas. At least some of charged particles not converged to the discharge ports 51A and 51B by the magnetic field MF, at least some of neutralized charged particles, and at least some of fine particles not adhering to the reflective surface 23A of the EUV light condenser mirror 23 react with part of unreacted etching gas flowing in the chamber 2. Generated products obtained through this reaction move toward the discharge ports 51A and 51B in the flow of unreacted etching gas. At least part of the unreacted etching gas flows into the discharge ports 51A and 51B.

The unreacted etching gas flowed into the discharge ports 51A and 51B and etching-gas components such as fine particles, charged particles, neutralized charged particles, and generated products described above flow into the discharge unit 5 in discharge flow and are provided with predetermined discharge treatment such as detoxification at the discharge unit 5.

3. EUV Light Condenser Mirror of Comparative Example

The following describes the EUV light condenser mirror of a comparative example in the extreme ultraviolet light generation apparatus described above. Any component identical to that in the above description is denoted by an identical reference sign, and duplicate description thereof will be omitted unless otherwise stated.

3.1 Configuration

Figure 2:
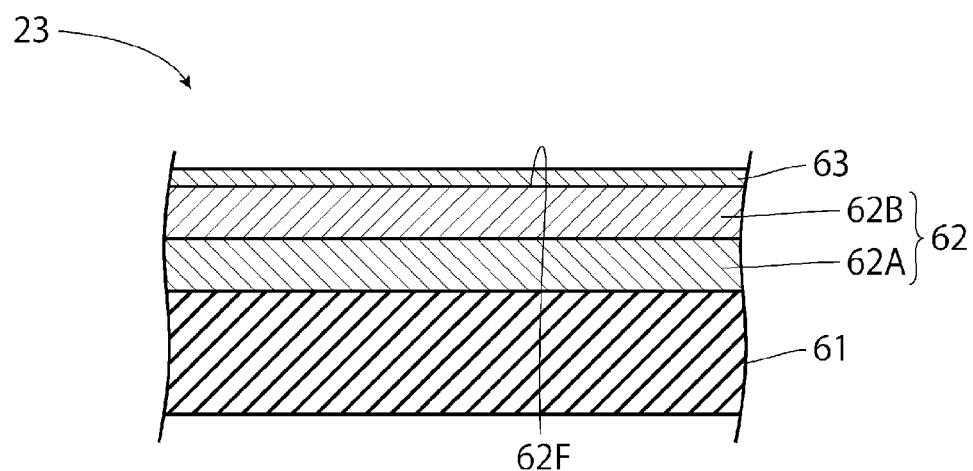
FIG. 2 is a pattern diagram illustrating a section of an EUV light condenser mirror.

FIG. 2 is a diagram illustrating a section of the EUV light condenser mirror. As illustrated in FIG. 2, the EUV light condenser mirror 23 includes a substrate 61, a reflective layer 62, and a protective layer 63. The reflective layer 62 may be achieved by, for example, two layers of a first layer 62A provided on the substrate 61, and a second layer 62B provided on the first layer 62A. The first layer 62A is, for example, a single layer formed by nickel plating, and the second layer 62B is, for example, a multi-layer formed by alternately stacking a Mo layer and a Si layer. The reflective surface 23A of the EUV light condenser mirror 23 includes the interface between the first layer 62A and the second layer 62B, the interface between the Mo layer and the Si layer in the second layer 62B, and a reflective layer surface 62F. The reflective layer surface 62F is a surface of the reflective layer 62 as the interface between the reflective layer surface 62F and the protective layer 63.

The protective layer 63 protects the reflective layer 62. A layer thickness as the thickness of the protective layer 63 is constant. The material of the protective layer 63 may be selected from among, for example, Ru, $SiO_2$, $Si_3N_4$, $Al_2O_3$, $Nb_2O_5$, $MoO_3$, $Y_2O_3$, $ZrO_2$, ZrN, $Sc_2O_3$, $CeO_2$, $Er_2O_3$, $Ta_2O_5$, $HfO_2$, $TiO_2$, and TiN. However, the material of the protective layer 63 may be a material other than those exemplarily illustrated materials.

3.2 Problem

As described above, charged particles generated from plasma of a droplet converge to the discharge ports 51A and 51B while moving on helical trajectories along the magnetic field line of the magnetic field MF generated by the magnetic field generation unit 4. In this case, some of the charged particles moving on helical trajectories collide with the protective layer 63 of the EUV light condenser mirror 23 in some cases.

When charged particles collide with the protective layer 63, the protective layer 63 is removed to expose part of the reflective layer 62, and this exposed part is contaminated by fine particles and the like, which potentially decreases the reflectance of EUV light at the reflective layer 62.

When the protective layer 63 has a large layer thickness, it is thought that exposure of part of the reflective layer 62 from the protective layer 63 due to collision of charged particles with the protective layer 63 is reduced. However, the protective layer 63 of the EUV light condenser mirror 23 of the comparative example has a constant layer thickness, and thus the reflectance of EUV light at the reflective layer 62 potentially decreases due to decrease of the transmittance of EUV light at the protective layer 63 when the layer thickness is uniformly increased.

Each embodiment below exemplarily describes an extreme ultraviolet light generation apparatus capable of suppressing decrease of the EUV light reflectance.

4. EUV Light Condenser Mirror of Embodiment 1

The following describes the configuration of the EUV light condenser mirror as Embodiment 1. Any component identical to that in the above description is denoted by an identical reference sign, and duplicate description thereof will be omitted unless otherwise stated.

4.1 Configuration

In the EUV light condenser mirror 23 of Embodiment 1, the protective layer 63 is configured to have layer thickness distribution in which the layer thickness of the protective layer 63 from the reflective layer surface 62F changes, which is a difference from the comparative example in which the layer thickness is constant.

Figure 3:
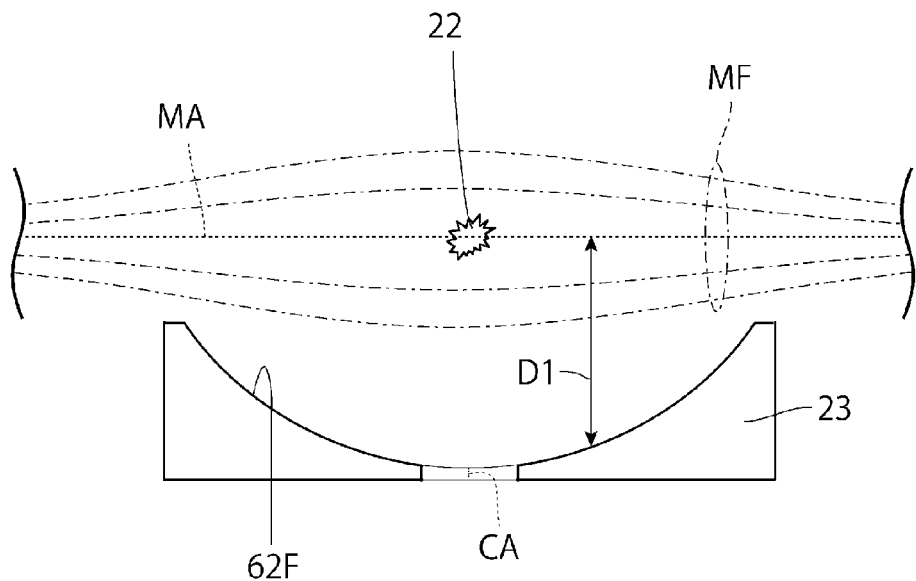
FIG. 3 is a pattern diagram illustrating the distance from a magnetic field axis.
Figure 4:
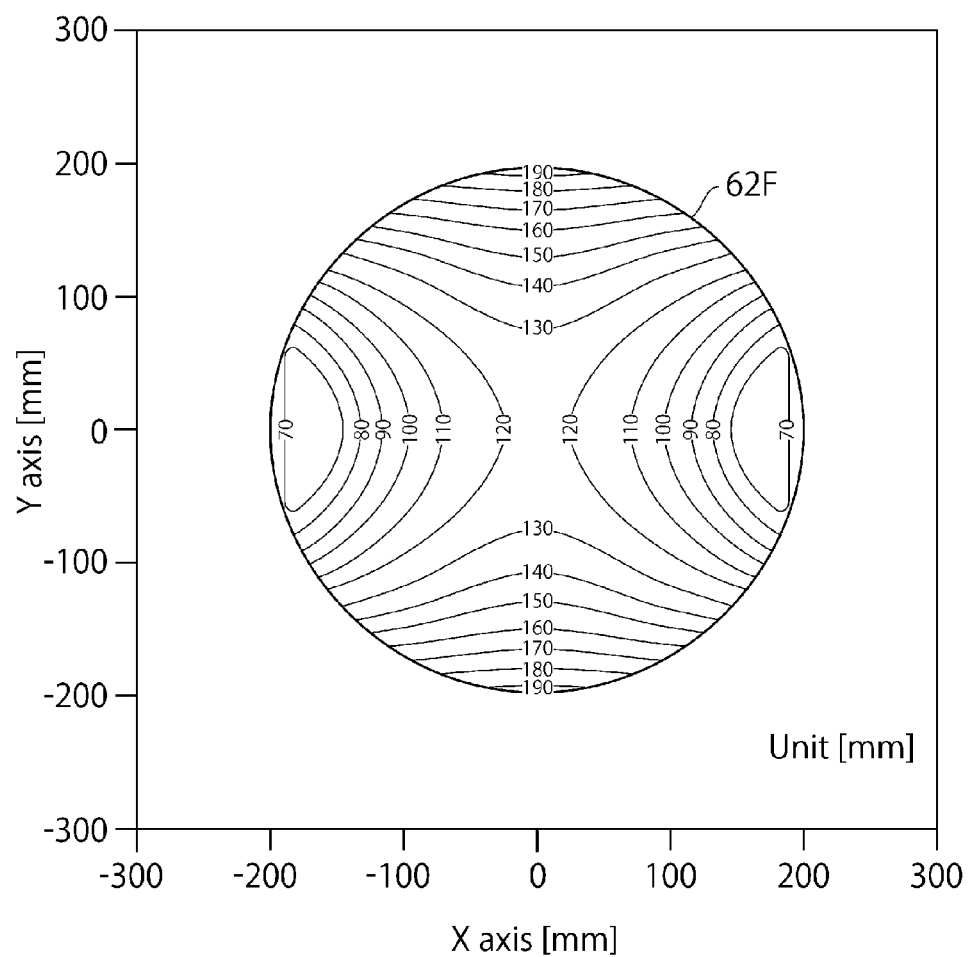
FIG. 4 is a diagram illustrating distance distribution of a reflective layer surface from the magnetic field axis.
Figure 5:
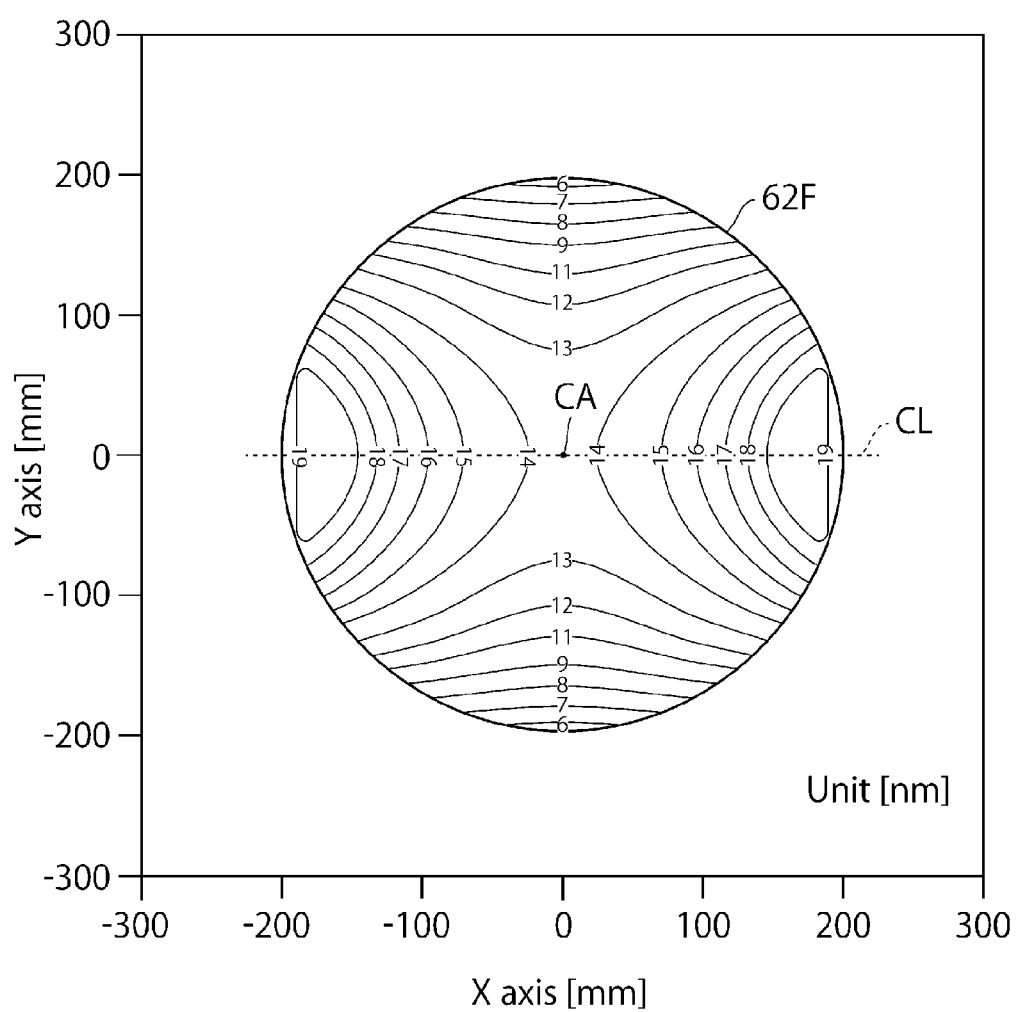
FIG. 5 is a diagram illustrating layer thickness distribution of a protective layer based on the distance distribution in FIG. 4.

FIG. 3 is a pattern diagram illustrating the distance from the magnetic field axis. FIG. 4 is a diagram illustrating distance distribution of the reflective layer surface from the magnetic field axis. FIG. 5 is a diagram illustrating the layer thickness distribution of the protective layer based on the distance distribution in FIG. 4. FIGS. 4 and 5 each illustrate a plan view when a projection plane orthogonal to the central axis CA of the EUV light condenser mirror 23 is placed between the reflective layer surface 62F having a spheroid shape and a plasma point and the reflective layer surface 62F is projected in parallel onto the projection plane with the plasma point as a viewpoint. As illustrated in FIG. 1, the plasma point is the condensation position of the laser beam PL condensed in the chamber 2.

Each numerical value on the reflective layer surface 62F in FIG. 4 indicates a distance D1 from the magnetic field axis MA of the magnetic field generation unit 4 in predetermined ranges. As illustrated in FIG. 3, the distance D1 from the magnetic field axis MA is the shortest distance between a target position on the reflective layer surface 62F and the magnetic field axis MA. The target position is optionally selected on the reflective layer surface 62F, and a plurality of target positions different from each other are selected. The target positions may contact each other or may be separated from each other. When the target positions are separated from each other, the intervals of the target positions may be equal to each other or may be different from each other.

Each numerical value on the reflective layer surface 62F in FIG. 5 is obtained by converting the corresponding numerical value on the reflective layer surface 62F in FIG. 4 into the layer thickness of the protective layer 63 through predetermined normalization. Specifically, each numerical value on the reflective layer surface 62F in FIG. 4 is converted into the layer thickness of the protective layer 63 with the layer thickness of the protective layer 63 being set to be 20 nm at a target position at which the distance D1 from the magnetic field axis MA is shortest and with the layer thickness of the protective layer 63 being set to be 5 nm at a position at which the distance D1 is largest. The maximum layer thickness is set to be 20 nm because the reflectance is likely to significantly decrease when the maximum layer thickness exceeds 20 nm. The minimum layer thickness is set to be 5 nm because, for example, hydrogen and oxygen potentially transmit through the protective layer 63 and degrade the reflective layer 62 when the minimum layer thickness is smaller than 5 nm. The difference between the maximum layer thickness and the minimum layer thickness in the present embodiment is 15 nm but may be other than 15 nm. However, the difference between the maximum layer thickness and the minimum layer thickness of the protective layer 63 is preferably equal to or larger than 10 nm.

As illustrated in FIGS. 3 to 5, the layer thickness distribution of the protective layer 63 in the present embodiment is defined based on the distance D1 between the magnetic field axis MA of the magnetic field generation unit 4 and the reflective layer surface 62F. In the layer thickness distribution of the protective layer 63, the layer thickness is larger at a position at which the distance D1 between the magnetic field axis MA and the reflective layer surface 62F is smaller. The layer thickness distribution of the protective layer 63 is plane symmetric with respect to a plane passing through the magnetic field axis MA of the magnetic field generation unit 4 and the central axis CA of the EUV light condenser mirror 23. As illustrated in FIG. 5, the layer thickness distribution of the protective layer 63 is line symmetric with respect to a central line CL of the reflective layer surface 62F when the reflective layer surface 62F is projected in parallel with the plasma point as a viewpoint. The central line CL of the reflective layer surface 62F is a line on which the plane passing through the magnetic field axis MA of the magnetic field generation unit 4 and the central axis CA of the EUV light condenser mirror 23 intersects the reflective layer surface 62F. The central line CL of the reflective layer surface 62F is a curved line but is a straight line as illustrated in FIG. 5 when the reflective layer surface 62F is projected in parallel. In addition, when the EUV light condenser mirror 23 is provided with the through-hole 23B, the layer thickness distribution of the protective layer 63 is point symmetric with respect to a point at which an opening plane of the through-hole 23B on the reflective layer surface 62F side intersects the central axis CA of the EUV light condenser mirror 23. When the EUV light condenser mirror 23 is not provided with the through-hole 23B, the layer thickness distribution of the protective layer 63 is point symmetric with respect to a point at which the central axis CA of the EUV light condenser mirror 23 intersects the reflective layer surface 62F. The layer thickness of the protective layer 63 is maximum at a position on the central line CL of the reflective layer surface 62F. The layer thickness of the protective layer 63 is maximum at a position at a site of the central line CL of the reflective layer surface 62F on the magnetic field generation unit 4 side of the central axis CA of the EUV light condenser mirror 23. The site on the magnetic field generation unit 4 side is on the magnetic field generation unit 4 side of the middle position between the central axis CA of the EUV light condenser mirror 23 and one end of the central line CL of the reflective layer surface 62F. When the magnetic field generation unit 4 includes the pair of coils 41A and 42A, the site exists for each of the coils 41A and 42A. In other words, the layer thickness of the protective layer 63 is maximum at a position on the one coil 41A side of the middle position between one end of the central line CL of the reflective layer surface 62F on the one coil 41A side and the central axis CA of the EUV light condenser mirror 23. Similarly, the layer thickness of the protective layer 63 is maximum also at a position on the other coil 42A side of the middle position between the other end of the central line CL of the reflective layer surface 62F on the other coil 42A side and the central axis CA of the EUV light condenser mirror 23. The layer thickness of the protective layer 63 is minimum at a position at a site most apart from the central line CL of the reflective layer surface 62F.

The method of manufacturing the protective layer 63 thus configured may be selected from among the following three manufacturing methods. However, a manufacturing method other than the following three manufacturing methods may be employed. In the first manufacturing method, the protective layer 63 having layer thickness distribution is manufactured by providing, on the entire reflective layer surface 62F of the reflective layer 62, a layer having the minimum layer thickness in the layer thickness distribution and then by repeating, a plurality of times, the process of adding a layer having a predetermined thickness while a mask is provided on a part other than a part at which the layer thickness is to be increased. In the second manufacturing method, the protective layer 63 having layer thickness distribution is manufactured by providing, on the entire reflective layer surface 62F of the reflective layer 62, a layer having the maximum layer thickness in the layer thickness distribution and then by performing the process of etching or polishing a part at which the layer thickness is to be reduced. In the third manufacturing method, the protective layer 63 having layer thickness distribution is manufactured by using a deposition device capable of performing local deposition.

4.2 Effect

As described above, a charged particle generated from plasma of a droplet in the plasma generation region 22 converges toward the wall of the chamber 2 while moving on a helical trajectory along the magnetic field line of the magnetic field MF generated by the magnetic field generation unit 4. Thus, the charged particle converging toward the wall of the chamber 2 is more likely to collide with the EUV light condenser mirror 23 as the reflective layer surface 62F is closer to the magnetic field axis MA of the magnetic field generation unit 4.

In the layer thickness distribution of the protective layer 63 in the present embodiment, the layer thickness is larger at a position at which the distance D1 between the magnetic field axis MA and the reflective layer surface 62F is smaller. Accordingly, the layer thickness is larger at a site with which charged particles are more likely to collide due to the relation with the magnetic field axis MA. Thus, decrease of the EUV light transmittance of the protective layer 63 is reduced, and contamination due to exposure of the reflective layer 62 from the protective layer 63 caused by charged particle collision is reduced, as compared to when the layer thickness of the protective layer 63 from the reflective layer surface 62F is uniformly increased. In this manner, the present embodiment provides an extreme ultraviolet light generation apparatus capable of suppressing decrease of the EUV light reflectance.

5. EUV Light Condenser Mirror of Embodiment 2

The following describes the configuration of the EUV light condenser mirror as Embodiment 2. Any component identical to that in the above description is denoted by an identical reference sign, and duplicate description thereof will be omitted unless otherwise stated.

5.1 Configuration

In the EUV light condenser mirror 23 of Embodiment 2, the protective layer 63 is configured to have layer thickness distribution in which the layer thickness of the protective layer 63 from the reflective layer surface 62F changes, which is a difference from the comparative example in which the layer thickness is constant.

Figure 6:
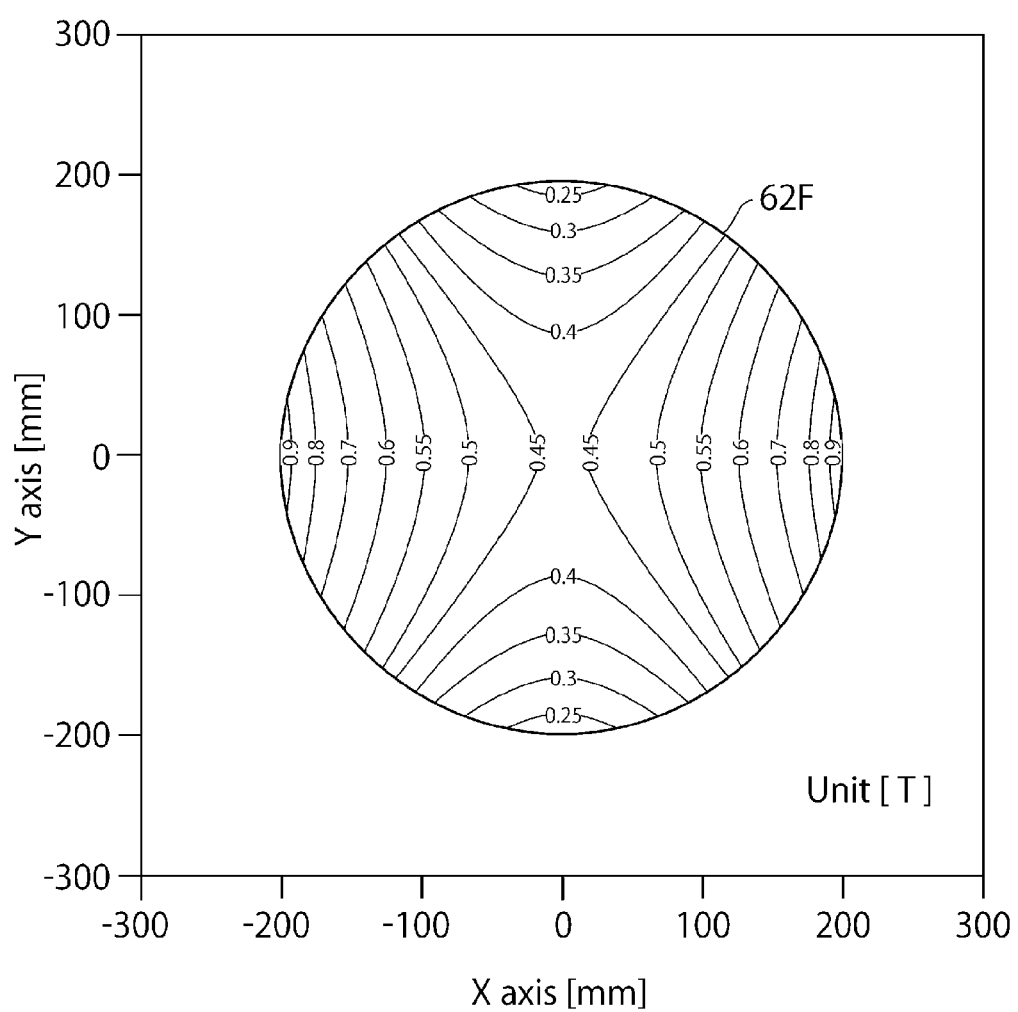
FIG. 6 is a diagram illustrating magnetic flux density distribution on the reflective layer surface.
Figure 7:
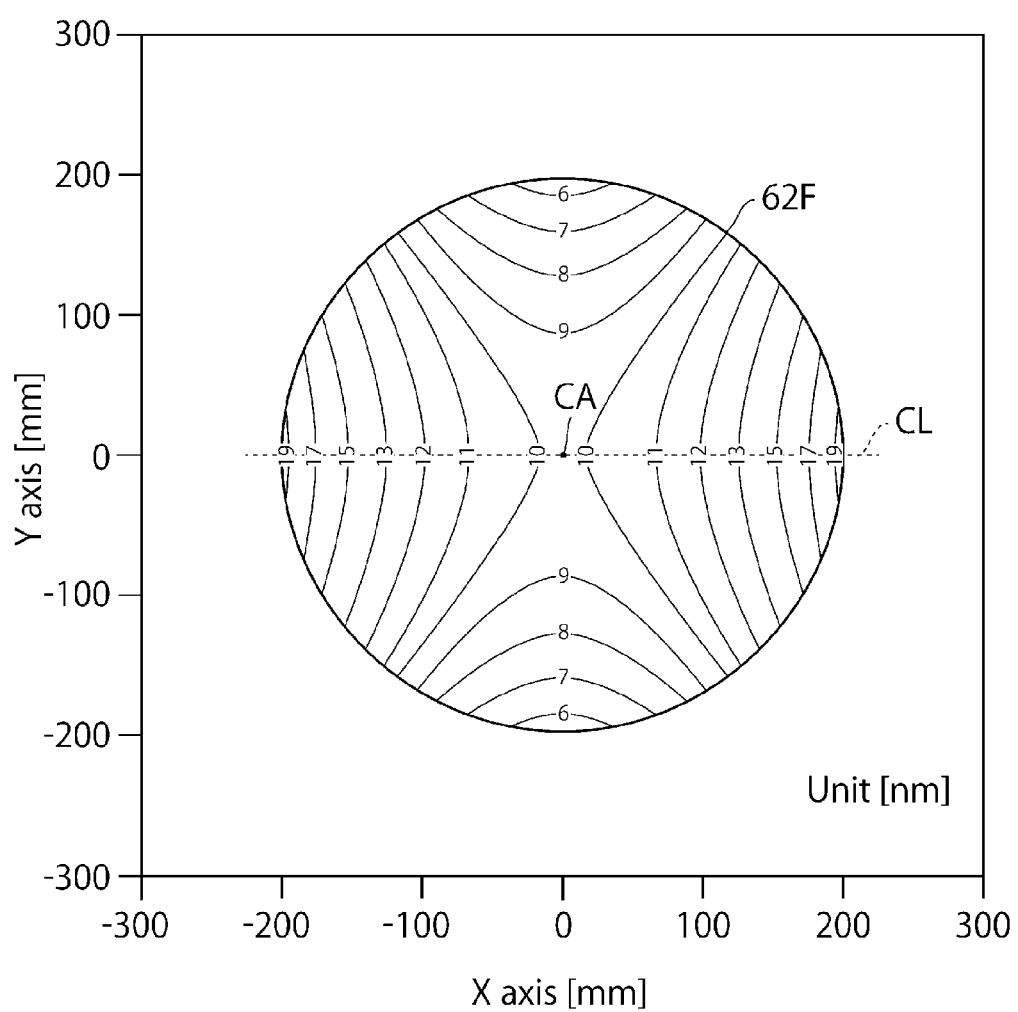
FIG. 7 is a diagram illustrating the layer thickness distribution of the protective layer based on the magnetic flux density distribution in FIG. 6.

FIG. 6 is a diagram illustrating magnetic flux density distribution of the reflective layer surface. FIG. 7 illustrates the layer thickness distribution of the protective layer based on the magnetic flux density distribution in FIG. 6. FIGS. 6 and 7 each illustrate a plan view when a projection plane orthogonal to the central axis CA of the EUV light condenser mirror 23 is placed between the reflective layer surface 62F having a spheroid shape and the plasma point and the reflective layer surface 62F is projected in parallel onto the projection plane with the plasma point as a viewpoint.

Each numerical value on the reflective layer surface 62F in FIG. 6 indicates the magnetic flux density distribution of the reflective layer surface 62F in predetermined ranges. On the reflective layer surface 62F, the magnetic flux density is taken to be "1" at a target position at which the magnetic flux density is highest, and the magnetic flux density is taken to be "0" at a target position at which the magnetic flux density is lowest.

Each numerical value on the reflective layer surface 62F in FIG. 7 is obtained by converting the corresponding numerical value on the reflective layer surface 62F in FIG. 6 into the layer thickness of the protective layer 63 through predetermined normalization. Specifically, each numerical value on the reflective layer surface 62F in FIG. 6 is converted into the layer thickness of the protective layer 63 with the layer thickness of the protective layer 63 being set to be 20 nm at a site at which the magnetic flux density of the reflective layer surface 62F is highest and with the layer thickness of the protective layer 63 being set to be 5 nm at a site at which the magnetic flux density is lowest. The difference between the maximum layer thickness and the minimum layer thickness in the present embodiment is 15 nm but may be other than 15 nm. However, the difference between the maximum layer thickness and the minimum layer thickness of the protective layer 63 is preferably equal to or larger than 10 nm.

As illustrated in FIGS. 6 and 7, the layer thickness distribution of the protective layer 63 in the present embodiment is defined based on the magnetic flux density of the magnetic field MF on the reflective layer surface 62F. In the layer thickness distribution of the protective layer 63, the layer thickness is larger at a position at which the magnetic flux density is higher. The layer thickness distribution of the protective layer 63 is plane symmetric with respect to the plane passing through the magnetic field axis MA of the magnetic field generation unit 4 and the central axis CA of the EUV light condenser mirror 23. As illustrated in FIG. 7, the layer thickness distribution of the protective layer 63 is line symmetric with respect to the central line CL of the reflective layer surface 62F when the reflective layer surface 62F is projected in parallel with the plasma point as a viewpoint. In addition, when the EUV light condenser mirror 23 is provided with the through-hole 23B, the layer thickness distribution of the protective layer 63 is point symmetric with respect to the point at which the opening plane of the through-hole 23B on the reflective layer surface 62F side intersects the central axis CA of the EUV light condenser mirror 23. When the EUV light condenser mirror 23 is not provided with the through-hole 23B, the layer thickness distribution of the protective layer 63 is point symmetric with respect to the point at which the central axis CA of the EUV light condenser mirror 23 intersects the reflective layer surface 62F. The layer thickness of the protective layer 63 is maximum at a position on the central line CL of the reflective layer surface 62F. Specifically, the layer thickness of the protective layer 63 is maximum at a position at a site nearest to the magnetic field generation unit 4 on the central line CL of the reflective layer surface 62F. The layer thickness of the protective layer 63 is minimum at a position at a site most apart from the reflective layer surface 62F the central line CL.

The method of manufacturing the protective layer 63 thus configured may be selected from among the three manufacturing methods described in Embodiment 1. However, a manufacturing method other than the three manufacturing methods described in Embodiment 1 may be employed.

5.2 Effect

As described above, a charged particle generated from plasma of a droplet in the plasma generation region 22 converges toward the wall of the chamber 2 while moving on a helical trajectory along the magnetic field line of the magnetic field MF generated by the magnetic field generation unit 4. Thus, the charged particle converging toward the wall of the chamber 2 is more likely to collide with the EUV light condenser mirror 23 at a position at which the magnetic flux density of the magnetic field MF on the reflective layer surface 62F is higher.

In the layer thickness distribution of the protective layer 63 in the present embodiment, the layer thickness is larger at a position at which the magnetic flux density of the magnetic field MF on the reflective layer surface 62F is higher. Accordingly, the layer thickness is larger at a site with which charged particles are more likely to collide due to the relation with the magnetic flux density. Thus, decrease of the EUV light transmittance of the protective layer 63 is reduced, and contamination due to exposure of the reflective layer 62 from the protective layer 63 caused by charged particle collision is reduced, as compared to when the layer thickness of the protective layer 63 from the reflective layer surface 62F is uniformly increased. In this manner, the present embodiment provides an extreme ultraviolet light generation apparatus capable of suppressing decrease of the EUV light reflectance.

6. EUV Light Condenser Mirror of Embodiment 3

The following describes the configuration of the EUV light condenser mirror as Embodiment 3. Any component identical to that in the above description is denoted by an identical reference sign, and duplicate description thereof will be omitted unless otherwise stated.

6.1 Configuration

In the EUV light condenser mirror 23 of Embodiment 3, the protective layer 63 is configured to have layer thickness distribution in which the layer thickness of the protective layer 63 from the reflective layer surface 62F changes, which is a difference from the comparative example in which the layer thickness is constant.

Figure 8:
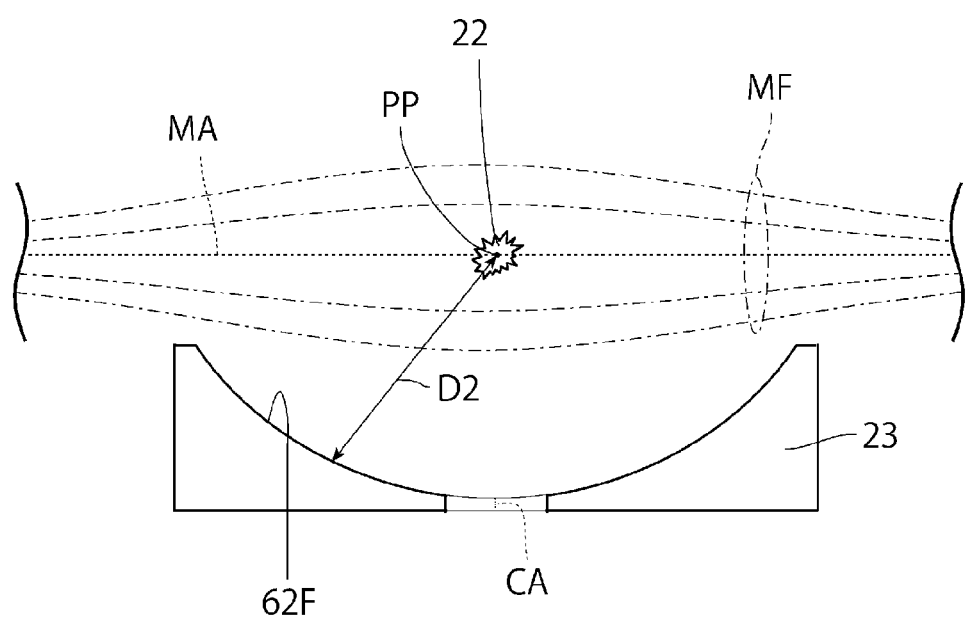
FIG. 8 is a pattern diagram illustrating the distance between the reflective layer surface and a plasma point.
Figure 9:
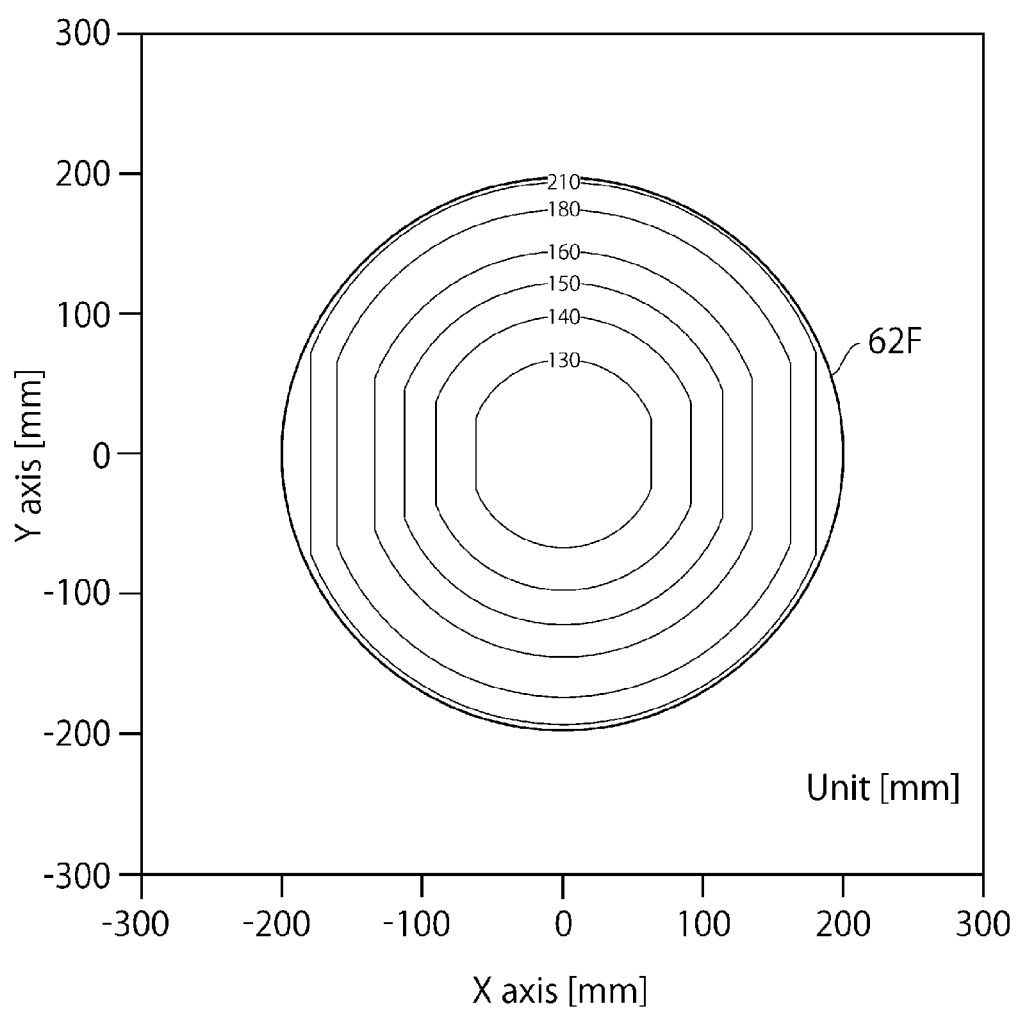
FIG. 9 is a diagram illustrating distance distribution of the reflective layer surface from the plasma point.
Figure 10:
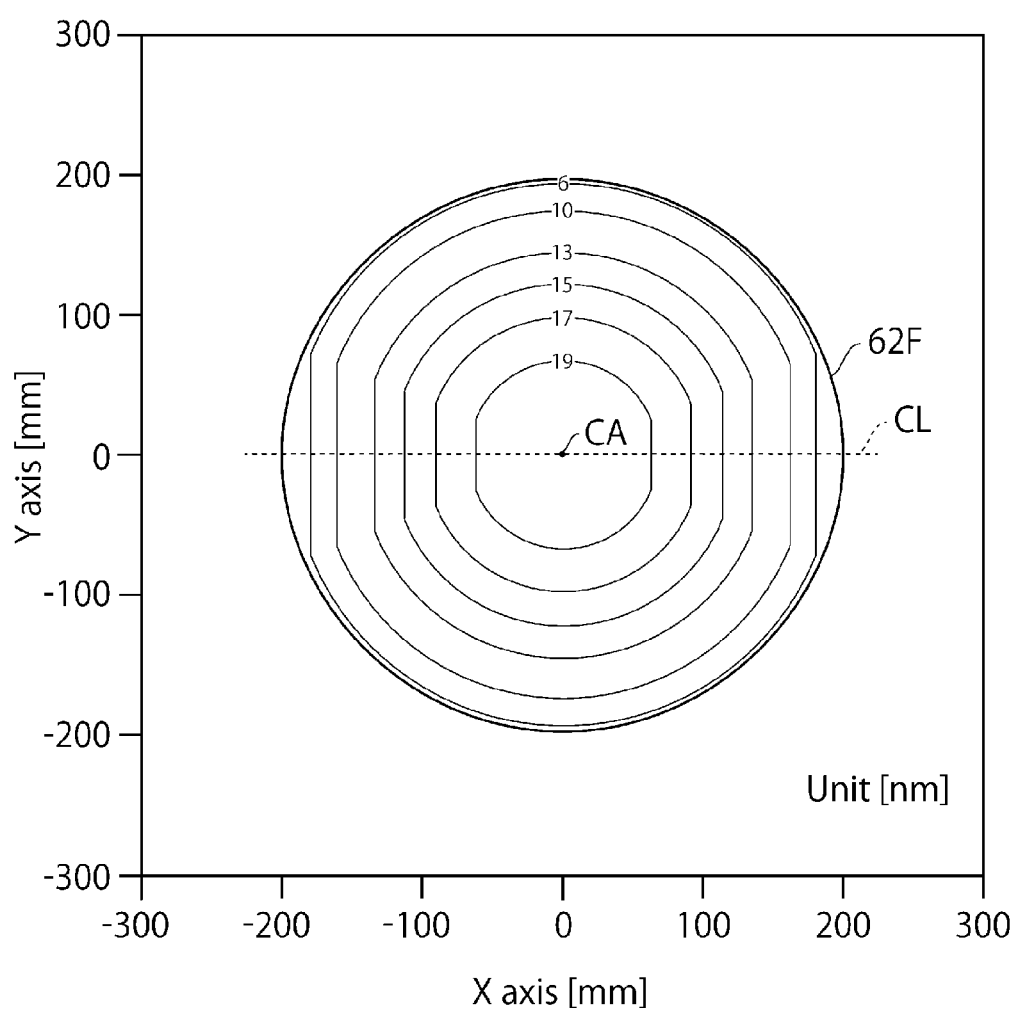
FIG. 10 is a diagram illustrating the layer thickness distribution of the protective layer based on the distance distribution in FIG. 9.

FIG. 8 is a pattern diagram illustrating the distance between the reflective layer surface and the plasma point. FIG. 9 is a diagram illustrating distance distribution of the reflective layer surface from the plasma point. FIG. 10 is a diagram illustrating the layer thickness distribution of the protective layer based on the distance distribution in FIG. 9. FIGS. 9 and 10 illustrate a plan view when a projection plane orthogonal to the central axis CA of the EUV light condenser mirror 23 is placed between the reflective layer surface 62F having a spheroid shape and the plasma point and the reflective layer surface 62F is projected in parallel onto the projection plane with the plasma point as a viewpoint.

Each numerical value on the reflective layer surface 62F in FIG. 9 indicates a distance D2 between the reflective layer surface 62F and a plasma point PP in predetermined ranges. As illustrated in FIG. 8, the distance D2 between the reflective layer surface 62F and the plasma point PP is the length of a straight line connecting a target position on the reflective layer surface 62F and the plasma point PP.

Each numerical value on the reflective layer surface 62F in FIG. 10 is obtained by converting the corresponding numerical value on the reflective layer surface 62F in FIG. 9 into the layer thickness of the protective layer 63 through predetermined normalization. Specifically, each numerical value on the reflective layer surface 62F in FIG. 9 is converted into the layer thickness of the protective layer 63 with the layer thickness of the protective layer 63 being set to be 20 nm at a site at which the distance D2 from the plasma point PP is shortest and with the layer thickness of the protective layer 63 being set to be 5 nm at a site at which the distance D2 is longest. The difference between the maximum layer thickness and the minimum layer thickness in the present embodiment is 15 nm but may be other than 15 nm. However, the difference between the maximum layer thickness and the minimum layer thickness of the protective layer 63 is preferably equal to or larger than 10 nm.

As illustrated in FIGS. 8 to 10, the layer thickness distribution of the protective layer 63 in the present embodiment is defined based on the distance D2 between the reflective layer surface 62F and the plasma point PP. In the layer thickness distribution of the protective layer 63, the layer thickness is larger at a position at which the distance D2 between the reflective layer surface 62F and the plasma point PP is shorter. The layer thickness distribution of the protective layer 63 is plane symmetric with respect to the plane passing through the magnetic field axis MA of the magnetic field generation unit 4 and the central axis CA of the EUV light condenser mirror 23. As illustrated in FIG. 10, the layer thickness distribution of the protective layer 63 is line symmetric with respect to the central line CL of the reflective layer surface 62F when the reflective layer surface 62F is projected in parallel with the plasma point as a viewpoint. In addition, when the EUV light condenser mirror 23 is provided with the through-hole 23B, the layer thickness distribution of the protective layer 63 is point symmetric with respect to the point at which the opening plane of the through-hole 23B on the reflective layer surface 62F side intersects the central axis CA of the EUV light condenser mirror 23. When the EUV light condenser mirror 23 is not provided with the through-hole 23B, the layer thickness distribution of the protective layer 63 is point symmetric with respect to the point at which the central axis CA of the EUV light condenser mirror 23 intersects the reflective layer surface 62F. The layer thickness of the protective layer 63 is maximum at a position on the central line CL of the reflective layer surface 62F. When the EUV light condenser mirror 23 is provided with the through-hole 23B, the layer thickness of the protective layer 63 is maximum at a position nearest to the central axis CA of the EUV light condenser mirror 23. When the EUV light condenser mirror 23 is not provided with the through-hole 23B, the layer thickness of the protective layer 63 is maximum at a position on the central axis CA of the EUV light condenser mirror 23. The layer thickness of the protective layer 63 is minimum at a position at a site most apart from the central axis CA of the EUV light condenser mirror 23.

The method of manufacturing the protective layer 63 thus configured may be selected from among the three manufacturing methods described in Embodiment 1. However, a manufacturing method other than the three manufacturing methods described in Embodiment 1 may be employed.

6.2 Effect

As described above, some of charged particles generated from plasma of a droplet in the plasma generation region 22 are not affected by the magnetic field MF generated by the magnetic field generation unit 4 but diffuse toward the EUV light condenser mirror 23 in some cases. Thus, the charged particles are more likely to collide with the EUV light condenser mirror 23 as the reflective layer surface 62F is closer to the plasma point PP.

In the layer thickness distribution of the protective layer 63 in the present embodiment, the layer thickness is larger at a position at which the distance D2 between the reflective layer surface 62F and the plasma point PP is longer. Accordingly, the layer thickness is larger at a site with which charged particles are more likely to collide due to the relation with the plasma point PP. Thus, decrease of the EUV light transmittance of the protective layer 63 is reduced, and contamination due to exposure of the reflective layer 62 from the protective layer 63 caused by charged particle collision is reduced, as compared to when the layer thickness of the protective layer 63 from the reflective layer surface 62F is uniformly increased. In this manner, the present embodiment provides an extreme ultraviolet light generation apparatus capable of suppressing decrease of the EUV light reflectance.

As described above, fine particles in addition to charged particles are generated from plasma of a droplet in the plasma generation region 22. The fine particles are unlikely to be affected by the magnetic field MF, and thus the fine particles are more likely to collide with the EUV light condenser mirror 23 as the reflective layer surface 62F is closer to the plasma point PP. In the layer thickness distribution of the protective layer 63 of the present embodiment, the layer thickness is larger at a position at which the distance D2 between the reflective layer surface 62F and the plasma point PP is longer, and thus contamination due to exposure of the reflective layer 62 from the protective layer 63 caused by fine particle collision can be reduced.

7. EUV Light Condenser Mirror of Embodiment 4

The following describes the configuration of the EUV light condenser mirror as Embodiment 4. Any component identical to that in the above description is denoted by an identical reference sign, and duplicate description thereof will be omitted unless otherwise stated.

7.1 Configuration

In the EUV light condenser mirror 23 of Embodiment 4, the protective layer 63 is configured to have layer thickness distribution in which the layer thickness of the protective layer 63 from the reflective layer surface 62F changes, which is a difference from the comparative example in which the layer thickness is constant.

Figure 11:
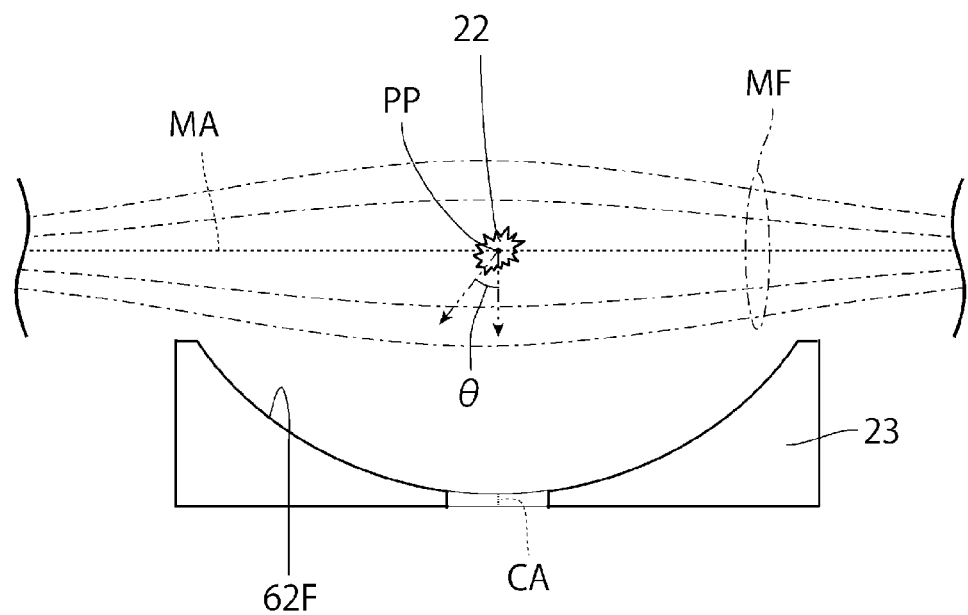
FIG. 11 is a pattern diagram illustrating the angle relative to the central axis of the EUV light condenser mirror.
Figure 12:
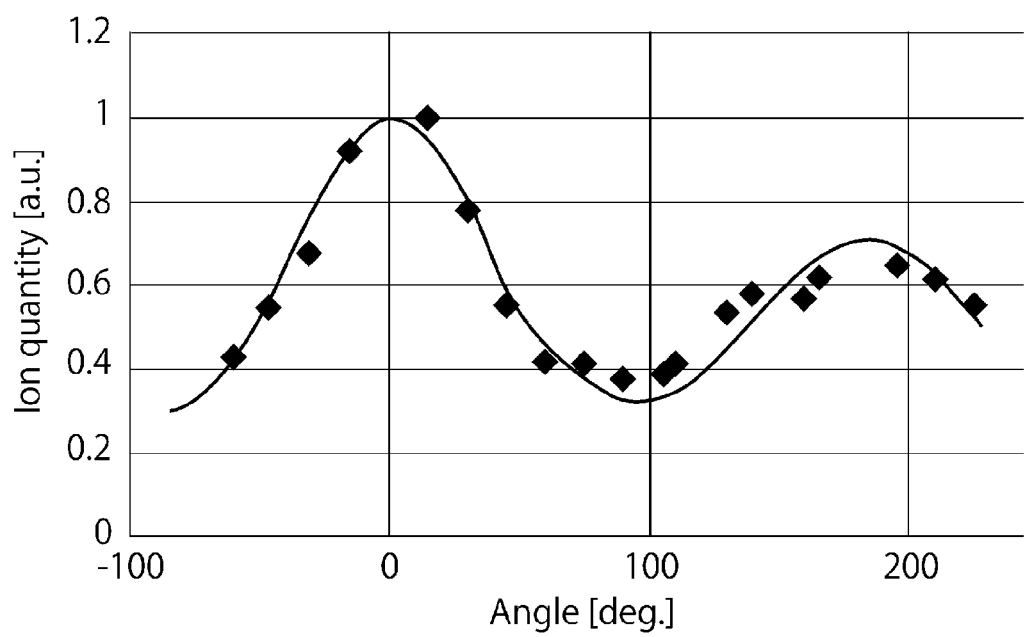
FIG. 12 is a graph illustrating the relation between the angle relative to the direction from the plasma point to the central axis of the EUV light condenser mirror and the charged particle quantity on the reflective layer surface in this angle direction.
Figure 13:
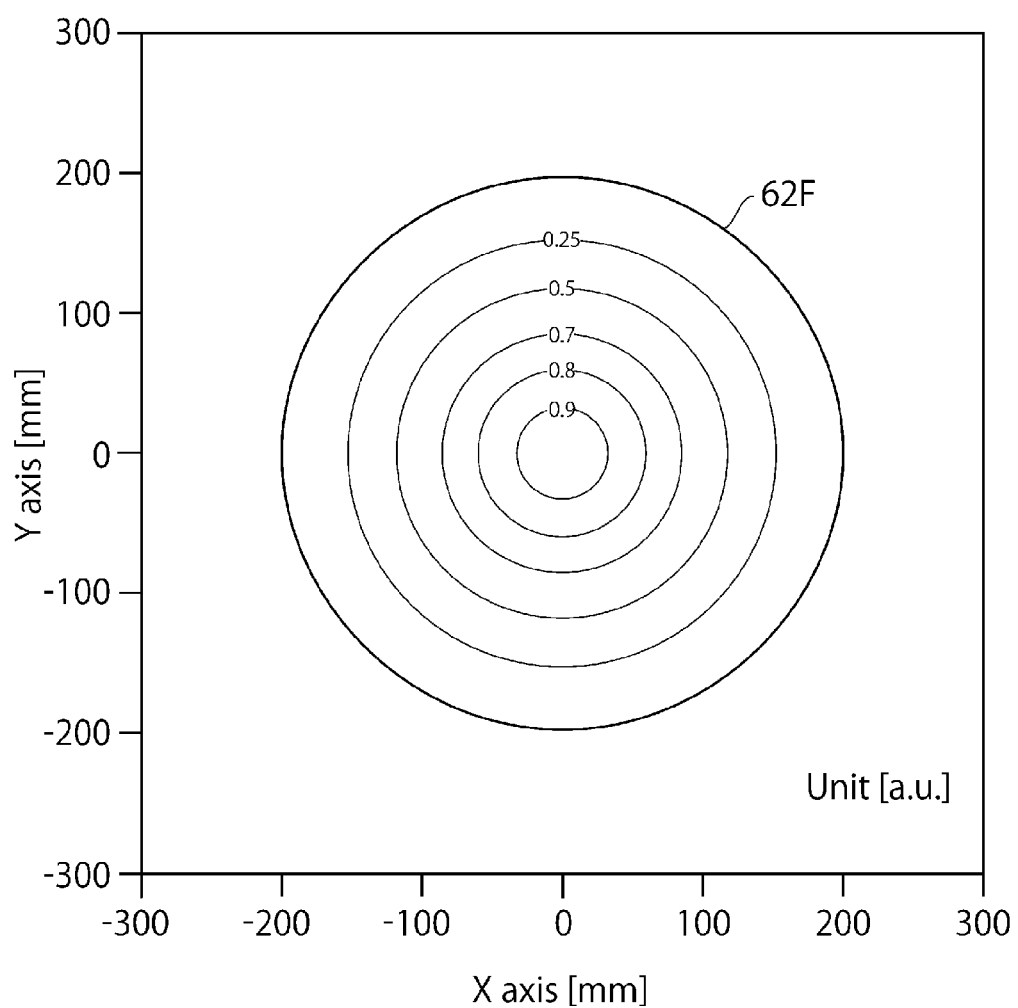
FIG. 13 is a diagram illustrating charged particle quantity distribution on the reflective layer surface.
Figure 14:
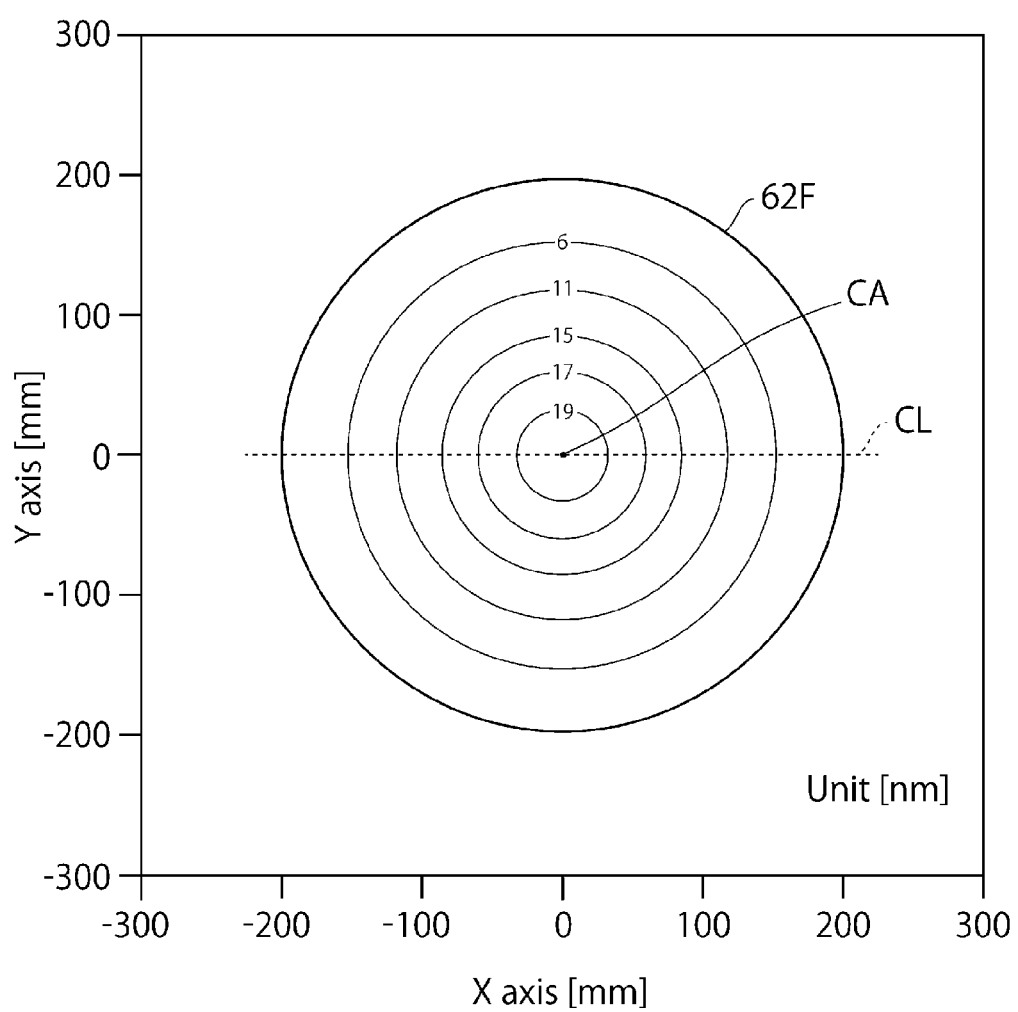
FIG. 14 is a diagram illustrating the layer thickness distribution of the protective layer based on the charged particle quantity distribution illustrated in FIG. 13.

FIG. 11 is a pattern diagram illustrating the angle relative to the central axis of the EUV light condenser mirror. FIG. 12 is a graph illustrating the relation between the angle relative to the direction from the plasma point to the central axis of the EUV light condenser mirror and the charged particle quantity on the reflective layer surface in this angle direction. FIG. 13 is a diagram illustrating charged particle quantity distribution of the reflective layer surface. FIG. 14 is a diagram illustrating the layer thickness distribution of the protective layer based on the charged particle quantity distribution illustrated in FIG. 13. FIGS. 13 and 14 each illustrate a plan view when a projection plane orthogonal to the central axis CA of the EUV light condenser mirror 23 is placed between the reflective layer surface 62F having a spheroid shape and the plasma point and the reflective layer surface 62F is projected in parallel onto the projection plane with the plasma point as a viewpoint.

Each numerical value on the reflective layer surface 62F in FIG. 13 indicates the charged particle quantity on the reflective layer surface 62F in predetermined ranges. On the reflective layer surface 62F, the charged particle quantity is taken to be "1" at a target position at which the charged particle quantity is largest, and the charged particle quantity is taken to be "0" at a target position at which the charged particle quantity is smallest. The charged particle quantity is calculated as follows. First, as illustrated in FIG. 11, a plurality of mutually different angles θ relative to the direction from the plasma point PP to the central axis CA of the EUV light condenser mirror 23 are selected. Subsequently, as illustrated in FIG. 12, the charged particle quantity at a target position on the reflective layer surface 62F in the direction of each selected angle is measured, and the charged particle quantity on the reflective layer surface 62F is calculated based on a curved line most approximate to the measured charged particle quantities.

Each numerical value on the reflective layer surface 62F in FIG. 14 is obtained by converting the corresponding numerical value on the reflective layer surface 62F in FIG. 13 into the layer thickness of the protective layer 63 through predetermined normalization. Specifically, each numerical value on the reflective layer surface 62F in FIG. 13 is converted into the layer thickness of the protective layer 63 with the layer thickness of the protective layer 63 being set to be 20 nm at a site at which the charged particle quantity is largest and with the layer thickness of the protective layer 63 being set to be 5 nm at a site at which the charged particle quantity is smallest. The difference between the maximum layer thickness and the minimum layer thickness in the present embodiment is 15 nm but may be other than 15 nm. However, the difference between the maximum layer thickness and the minimum layer thickness of the protective layer 63 is preferably equal to or longer than 10 nm.

As illustrated in FIGS. 11 to 14, the layer thickness distribution of the protective layer 63 in the present embodiment is defined based on the charged particle quantity on the reflective layer surface 62F. In the layer thickness distribution of the protective layer 63, the layer thickness is larger at a position at which the charged particle quantity on the reflective layer surface 62F is larger. The layer thickness distribution of the protective layer 63 is plane symmetric with respect to the plane passing through the magnetic field axis MA of the magnetic field generation unit 4 and the central axis CA of the EUV light condenser mirror 23. As illustrated in FIG. 14, the layer thickness distribution of the protective layer 63 is line symmetric with respect to the central line CL of the reflective layer surface 62F when the reflective layer surface 62F is projected in parallel with the plasma point as a viewpoint. In addition, when the EUV light condenser mirror 23 is provided with the through-hole 23B, the layer thickness distribution of the protective layer 63 is point symmetric with respect to the point at which the opening plane of the through-hole 23B on the reflective layer surface 62F side intersects the central axis CA of the EUV light condenser mirror 23. When the EUV light condenser mirror 23 is not provided with the through-hole 23B, the layer thickness distribution of the protective layer 63 is point symmetric with respect to the point at which the central axis CA of the EUV light condenser mirror 23 intersects the reflective layer surface 62F. The layer thickness of the protective layer 63 is maximum at a position on the central line CL of the reflective layer surface 62F. When the EUV light condenser mirror 23 is provided with the through-hole 23B, the layer thickness of the protective layer 63 is maximum at a position nearest to the central axis CA of the EUV light condenser mirror 23. When the EUV light condenser mirror 23 is not provided with the through-hole 23B, the layer thickness of the protective layer 63 is maximum at a position on the central axis CA of the EUV light condenser mirror 23. The layer thickness of the protective layer 63 is minimum at a position at a site most apart from the central axis CA of the EUV light condenser mirror 23.

The method of manufacturing the protective layer 63 thus configured may be selected from among the three manufacturing methods described in Embodiment 1. However, a manufacturing method other than the three manufacturing methods described in Embodiment 1 may be employed.

7.2 Effect

As described above, some of charged particles generated from plasma of a droplet in the plasma generation region 22 are not affected by the magnetic field MF generated by the magnetic field generation unit 4 but diffuse toward the EUV light condenser mirror 23 in some cases.

In the layer thickness distribution of the protective layer 63 in the present embodiment, the layer thickness is larger at a position at which the charged particle quantity on the reflective layer surface 62F is larger. Accordingly, the layer thickness is larger at a site with which charged particles are more likely to collide due to the direct relation with the charged particle quantity diffusing from the plasma point PP. Thus, decrease of the EUV light transmittance of the protective layer 63 is reduced, and contamination due to exposure of the reflective layer 62 from the protective layer 63 caused by charged particle collision is reduced, as compared to when the layer thickness of the protective layer 63 from the reflective layer surface 62F is uniformly increased. In this manner, the present embodiment provides an extreme ultraviolet light generation apparatus capable of suppressing decrease of the EUV light reflectance.

As described above, fine particles in addition to charged particles are generated from plasma of a droplet in the plasma generation region 22. The fine particles are unlikely to be affected by the magnetic field MF and thus diffuse. The number of diffusing fine particles is largest on the optical axis of the laser beam PL incident at the plasma point PP, and is substantially proportional to the charged particle quantity. In the layer thickness distribution of the protective layer 63 of the present embodiment, the layer thickness is larger at a position at which the charged particle quantity on the reflective layer surface 62F is larger, and thus contamination due to exposure of the reflective layer 62 from the protective layer 63 caused by fine particle collision substantially proportional to the charged particle quantity can be reduced.

8. EUV Light Condenser Mirror of Embodiment 5

The following describes the configuration of the EUV light condenser mirror as Embodiment 5. Any component identical to that in the above description is denoted by an identical reference sign, and duplicate description thereof will be omitted unless otherwise stated.

7.1 Configuration

In the EUV light condenser mirror 23 of Embodiment 5, the protective layer 63 is configured to have layer thickness distribution in which the layer thickness of the protective layer 63 from the reflective layer surface 62F changes, which is a difference from the comparative example in which the layer thickness is constant.

Figure 15:
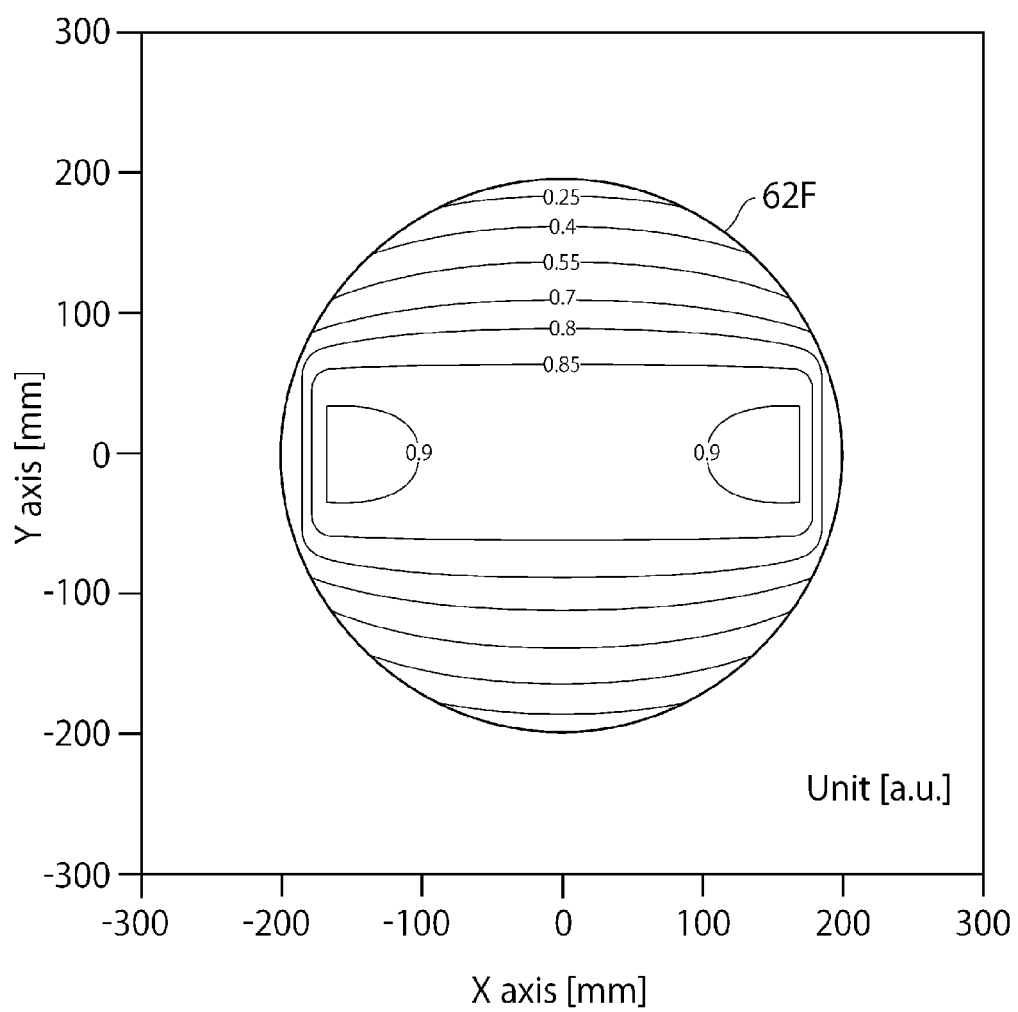
FIG. 15 is a diagram illustrating first combination distribution.
Figure 16:
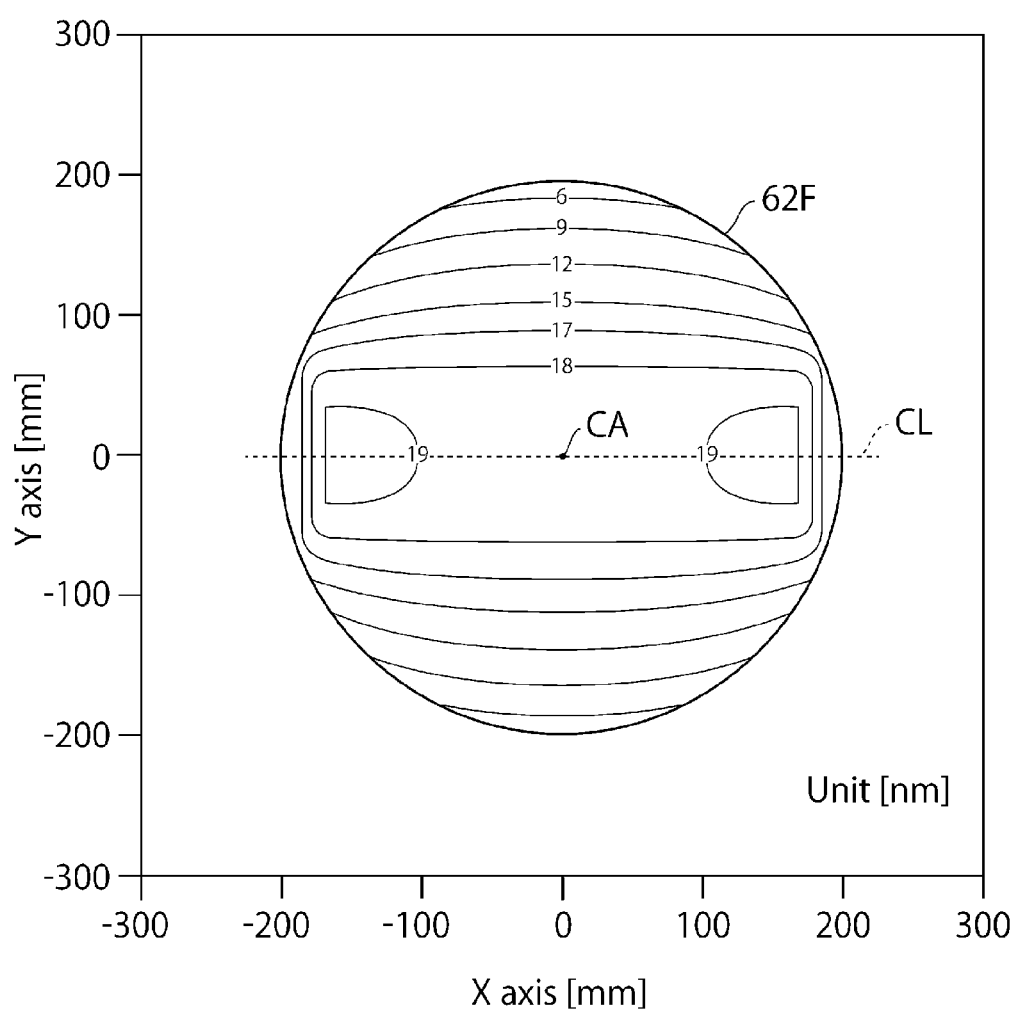
FIG. 16 is a diagram illustrating the layer thickness distribution of the protective layer based on the first combination distribution illustrated in FIG. 15.

FIG. 15 is a diagram illustrating first combination distribution. FIG. 16 is a diagram illustrating the layer thickness distribution of the protective layer based on the first combination distribution illustrated in FIG. 15. FIGS. 15 and 16 each illustrate a plan view when a projection plane orthogonal to the central axis CA of the EUV light condenser mirror 23 is placed between the reflective layer surface 62F having a spheroid shape and the plasma point and the reflective layer surface 62F is projected in parallel onto the projection plane with the plasma point as a viewpoint.

Each numerical value on the reflective layer surface 62F in FIG. 15 is a layer thickness distribution coefficient acquired by Expression (1) below with the first distance D1 illustrated in FIG. 4 and the second distance D2 illustrated in FIG. 9. However, the layer thickness distribution coefficient may be obtained by a statistical method other than Expression (1).

[Expression 1]

$$R = a\left(\frac{L - L_{max}}{L_{min} - L_{max}}\right) + c\left(\frac{P - P_{max}}{P_{min} - P_{max}}\right) \quad (1)$$

In the Expression (1), R is the layer thickness distribution coefficient. In the Expression (1), L is the first distance D1 from a target position to the magnetic field axis MA, $L_{min}$ is the minimum value of the first distance D1, and $L_{max}$ is the maximum value of the first distance D1. In the Expression (1), P is the second distance D2 from the target position to the plasma point PP, $P_{min}$ is the minimum value of the second distance D2, and $P_{max}$ is the maximum value of the second distance D2. Since a plurality of target positions are optionally selected as described above, L and P in the Expression (1) are variables. In the Expression (1), a is a weight coefficient allocated to the first distance D1, and c is a weight coefficient allocated to the second distance D2. The weight coefficient c may be larger than the weight coefficient a. In the present embodiment, according to the Expression (1), the ratio of the first distance D1 from the target position relative to the change range of the first distance D1 is calculated and multiplied by the weight coefficient a corresponding to the first distance D1. In addition, the ratio of the second distance D2 from the target position relative to the change range of the second distance D2 is calculated and multiplied by the weight coefficient c corresponding to the second distance D2. Then, a value obtained by summing results of the multiplication is set as the layer thickness distribution coefficient R.

Each numerical value on the reflective layer surface 62F in FIG. 16 is obtained by converting the corresponding layer thickness distribution coefficient on the reflective layer surface 62F in FIG. 15 into the layer thickness of the protective layer 63. For example, the layer thickness distribution coefficient R acquired by Expression (1) is converted into the layer thickness of the protective layer 63 by Expression (2) below. However, the layer thickness distribution coefficient may be converted into the layer thickness of the protective layer 63 by a statistical method other than Expression (2).

[Expression 2]

$$T = \frac{R}{(a + c)} \quad (2)$$

In the Expression (2), T is the layer thickness of the protective layer 63. In the Expression (2), R, a, and c are the same as those in Expression (1) above, respectively. The difference between the maximum layer thickness and the minimum layer thickness in the present embodiment is 15 nm but may be other than 15 nm. However, the difference between the maximum layer thickness and the minimum layer thickness of the protective layer 63 is preferably equal to or longer than 10 nm.

As illustrated in FIGS. 15 and 16, the layer thickness distribution of the protective layer 63 in the present embodiment is defined based on the first distance D1 between the magnetic field axis MA of the magnetic field generation unit 4 and the reflective layer surface 62F, and the second distance D2 between the plasma point PP and the reflective layer surface 62F. In the layer thickness distribution of the protective layer 63, the layer thickness is larger at a position at which the layer thickness distribution coefficient obtained by Expression (1) above is larger. The layer thickness distribution of the protective layer 63 is plane symmetric with respect to the plane passing through the magnetic field axis MA of the magnetic field generation unit 4 and the central axis CA of the EUV light condenser mirror 23. As illustrated in FIG. 16, the layer thickness distribution of the protective layer 63 is line symmetric with respect to the central line CL of the reflective layer surface 62F when the reflective layer surface 62F is projected in parallel with the plasma point as a viewpoint. In addition, when the EUV light condenser mirror 23 is provided with the through-hole 23B, the layer thickness distribution of the protective layer 63 is point symmetric with respect to the point at which the opening plane of the through-hole 23B on the reflective layer surface 62F side intersects the central axis CA of the EUV light condenser mirror 23. When the EUV light condenser mirror 23 is not provided with the through-hole 23B, the layer thickness distribution of the protective layer 63 is point symmetric with respect to the point at which the central axis CA of the EUV light condenser mirror 23 intersects the reflective layer surface 62F. The layer thickness of the protective layer 63 is maximum at a position on the central line CL of the reflective layer surface 62F. Specifically, the layer thickness of the protective layer 63 is maximum at a position at a site of the central line CL of the reflective layer surface 62F on the magnetic field generation unit 4 side of the central axis CA of the EUV light condenser mirror 23. As described above, the site on the magnetic field generation unit 4 side is on the magnetic field generation unit 4 side of the middle position between the central axis CA of the EUV light condenser mirror 23 and one end of the central line CL of the reflective layer surface 62F. The layer thickness of the protective layer 63 is minimum at a position at a site most apart from the reflective layer surface 62F the central line CL.

The method of manufacturing the protective layer 63 thus configured may be selected from among the three manufacturing methods described in Embodiment 1. However, a manufacturing method other than the three manufacturing methods described in Embodiment 1 may be employed.

8.2 Effect

As described above, most of charged particles generated from plasma of a droplet in the plasma generation region 22 are affected by the magnetic field MF and converge toward the wall of the chamber 2, but fine particles generated from the plasma are not affected by the magnetic field MF and are likely to diffuse.

Accordingly, the first distance D1 between the magnetic field axis MA of the magnetic field generation unit 4 and the reflective layer surface 62F is more likely to reflect the tendency of collision of charged particles, which are affected by the magnetic field MF, with the reflective layer surface 62F than the tendency of collision of fine particles, which are unlikely to be affected by the magnetic field MF, with the reflective layer surface 62F. However, the second distance D2 between the plasma point PP and the reflective layer surface 62F is more likely to reflect the tendency of collision of fine particles with the reflective layer surface 62F than the tendency of collision of charged particles with the reflective layer surface 62F.

The layer thickness distribution of the protective layer 63 in the present embodiment is defined based on both of the first distance D1 and the second distance D2. Accordingly, in the present embodiment, the tendency that collision with the reflective layer surface 62F is likely to occur can be reflected as compared to when the layer thickness distribution of the protective layer 63 is defined based on only one of the first distance D1 and the second distance D2. Thus, according to the present embodiment, contamination of the reflective layer 62 being exposed from the protective layer 63 can be further reduced.

9. EUV Light Condenser Mirror of Embodiment 6

The following describes the configuration of the EUV light condenser mirror as Embodiment 6. Any component identical to that in the above description is denoted by an identical reference sign, and duplicate description thereof will be omitted unless otherwise stated.

7.1 Configuration

In the EUV light condenser mirror 23 of Embodiment 6, the protective layer 63 is configured to have layer thickness distribution in which the layer thickness of the protective layer 63 from the reflective layer surface 62F changes, which is a difference from the comparative example in which the layer thickness is constant.

Figure 17:
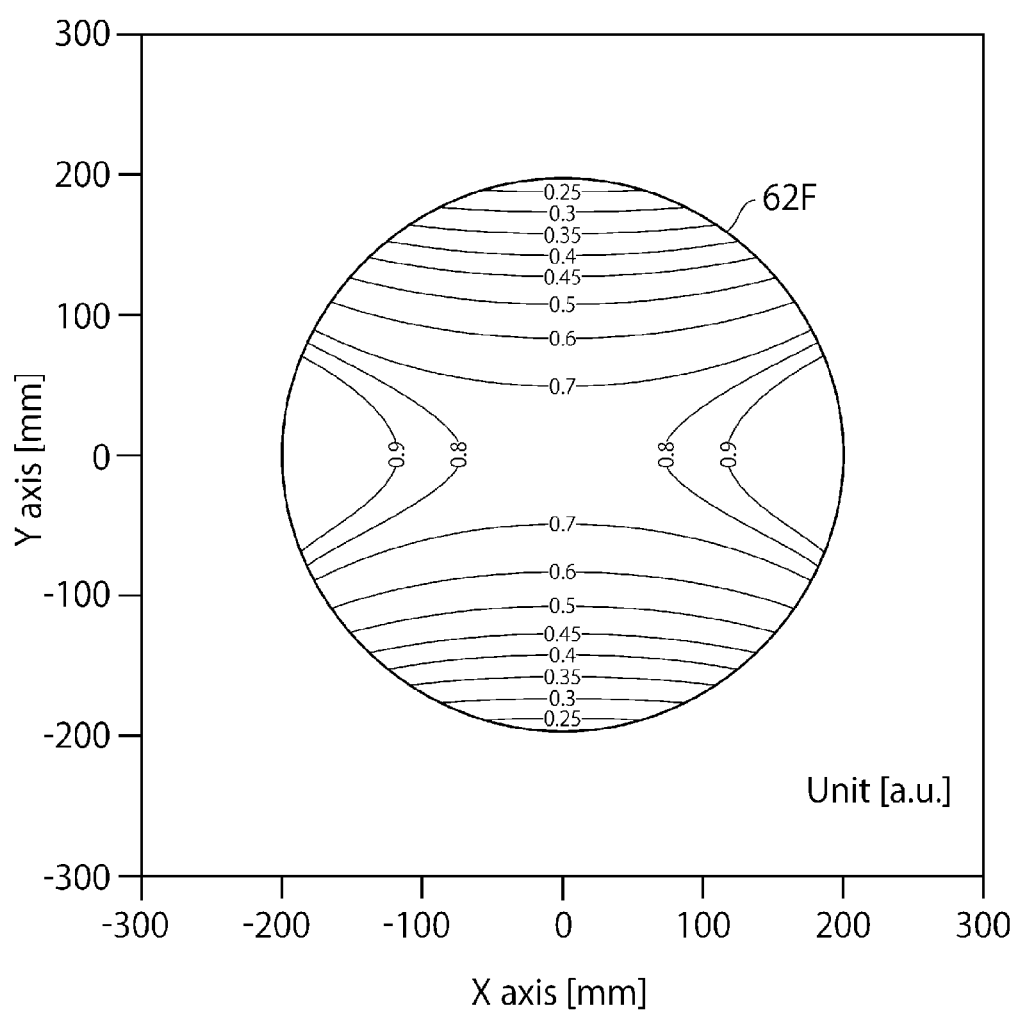
FIG. 17 is a diagram illustrating second combination distribution.
Figure 18:
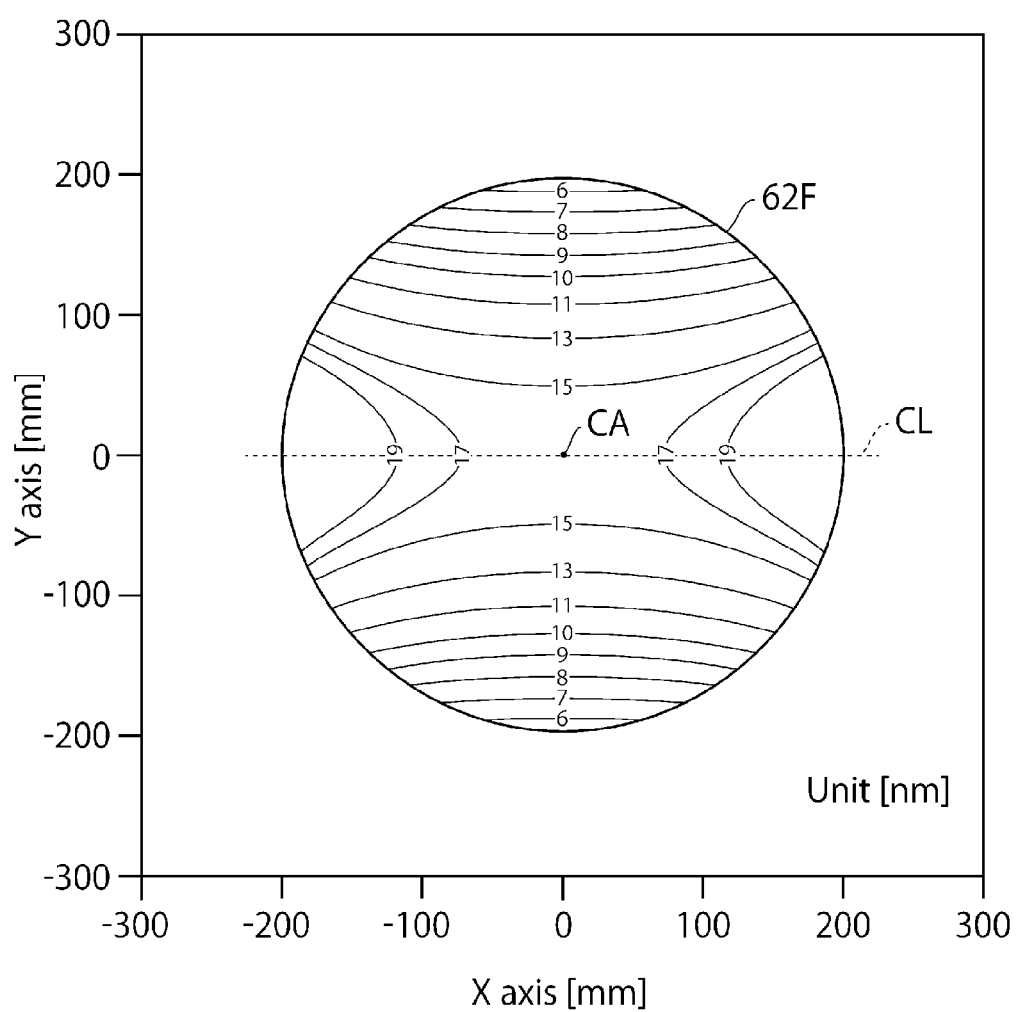
FIG. 18 is a diagram illustrating the layer thickness distribution of the protective layer based on the second combination distribution illustrated in FIG. 17.

FIG. 17 is a diagram illustrating second combination distribution. FIG. 18 is a diagram illustrating the layer thickness distribution of the protective layer based on the second combination distribution illustrated in FIG. 17. FIGS. 17 and 18 each illustrate a plan view when a projection plane orthogonal to the central axis CA of the EUV light condenser mirror 23 is placed between the reflective layer surface 62F having a spheroid shape and the plasma point and the reflective layer surface 62F is projected in parallel onto the projection plane with the plasma point as a viewpoint.

Each numerical value on the reflective layer surface 62F in FIG. 17 is a layer thickness distribution coefficient acquired by Expression (3) below with the magnetic flux density illustrated in FIG. 6 and the second distance D2 illustrated in FIG. 9. However, the layer thickness distribution coefficient may be obtained by a statistical method other than Expression (3).

[Expression 3]

$$R = b\left(\frac{B - B_{min}}{B_{max} - B_{min}}\right) + c\left(\frac{P - P_{max}}{P_{min} - P_{max}}\right) \quad (3)$$

In the Expression (3), B is the magnetic flux density at a target position on the reflective layer surface 62F, and is a variable since a plurality of target positions are optionally selected as described above. In the Expression (3), $B_{min}$ is the minimum value of the magnetic flux density, $B_{max}$ is the maximum value of the magnetic flux density, and b is a weight coefficient allocated to the magnetic flux density. The weight coefficient b may be smaller than the weight coefficient c. In the Expression (3), R, P, $P_{min}$, $P_{max}$, and c are the same as those in Expression (1) above, respectively. In the present embodiment, according to Expression (3), the ratio of the magnetic flux density at the target position relative to the change range of the magnetic flux density is calculated and multiplied by the weight coefficient b corresponding to the magnetic flux density. In addition, the ratio of the second distance D2 from the target position relative to the change range of the second distance D2 is calculated and multiplied by the weight coefficient c corresponding to the second distance D2. Then, a value obtained by summing results of the multiplication is set as the layer thickness distribution coefficient R.

Each numerical value on the reflective layer surface 62F in FIG. 18 is obtained by converting the corresponding layer thickness distribution coefficient on the reflective layer surface 62F in FIG. 17 into the layer thickness of the protective layer 63. For example, the layer thickness distribution coefficient R acquired by Expression (3) is converted into the layer thickness of the protective layer 63 by Expression (4) below. However, the layer thickness distribution coefficient may be converted into the layer thickness of the protective layer 63 by a statistical method other than Expression (4).

[Expression 4]

$$T = \frac{R}{(b + c)} \quad (4)$$

In the Expression (4), T is the layer thickness of the protective layer 63. In the Expression (4), R, b, and c are the same as Expression (3) above, respectively. The difference between the maximum layer thickness and the minimum layer thickness in the present embodiment is 15 nm but may be other than 15 nm. However, the difference between the maximum layer thickness and the minimum layer thickness of the protective layer 63 is preferably equal to or longer than 10 nm.

As illustrated in FIGS. 17 and 18, the layer thickness distribution of the protective layer 63 in the present embodiment is defined based on the magnetic flux density of the reflective layer surface 62F and the second distance D2 between the plasma point PP and the reflective layer surface 62F. In the layer thickness distribution of the protective layer 63, the layer thickness is larger at a position at which the layer thickness distribution coefficient obtained by Expression (3) above is larger. The layer thickness distribution of the protective layer 63 is plane symmetric with respect to the plane passing through the magnetic field axis MA of the magnetic field generation unit 4 and the central axis CA of the EUV light condenser mirror 23. As illustrated in FIG. 18, the layer thickness distribution of the protective layer 63 is line symmetric with respect to the central line CL of the reflective layer surface 62F when the reflective layer surface 62F is projected in parallel with the plasma point as a viewpoint. In addition, when the EUV light condenser mirror 23 is provided with the through-hole 23B, the layer thickness distribution of the protective layer 63 is point symmetric with respect to the point at which the opening plane of the through-hole 23B on the reflective layer surface 62F side intersects the central axis CA of the EUV light condenser mirror 23. When the EUV light condenser mirror 23 is not provided with the through-hole 23B, the layer thickness distribution of the protective layer 63 is point symmetric with respect to the point at which the central axis CA of the EUV light condenser mirror 23 intersects the reflective layer surface 62F. The layer thickness of the protective layer 63 is maximum at a position on the central line CL of the reflective layer surface 62F. Specifically, the layer thickness of the protective layer 63 is maximum at a position at a site nearest to the magnetic field generation unit 4 on the central line CL of the reflective layer surface 62F. The layer thickness of the protective layer 63 is minimum at a position at a site most apart from the central axis CA of the EUV light condenser mirror 23.

The method of manufacturing the protective layer 63 thus configured may be selected from among the three manufacturing methods described in Embodiment 1. However, a manufacturing method other than the three manufacturing methods described in Embodiment 1 may be employed.

9.2 Effect

As described above, most of charged particles generated from plasma of a droplet in the plasma generation region 22 are affected by the magnetic field MF and converge toward the wall of the chamber 2, but fine particles generated from the plasma are not affected by the magnetic field MF and are likely to diffuse.

Thus, the magnetic flux density on the reflective layer surface 62F is more likely to reflect the tendency of collision of charged particles, which are affected by the magnetic field MF, with the reflective layer surface 62F than the tendency of collision of fine particles, which are unlikely to be affected by the magnetic field MF, with the reflective layer surface 62F. However, as described above, the second distance D2 between the plasma point PP and the reflective layer surface 62F is more likely to reflect the tendency of collision of fine particles with the reflective layer surface 62F than the tendency of collision of charged particles with the reflective layer surface 62F.

The layer thickness distribution of the protective layer 63 in the present embodiment is defined based on both of the magnetic flux density on the reflective layer surface 62F and the second distance D2. Accordingly, in the present embodiment, the tendency that collision with the reflective layer surface 62F is likely to occur can be reflected as compared to when the layer thickness distribution of the protective layer 63 is defined based on only one of the magnetic flux density on the reflective layer surface 62F and the second distance D2. Thus, according to the present embodiment, contamination of the reflective layer 62 being exposed from the protective layer 63 can be further reduced.

10. EUV Light Condenser Mirror of Embodiment 7

The following describes the configuration of the EUV light condenser mirror as Embodiment 7. Any component identical to that in the above description is denoted by an identical reference sign, and duplicate description thereof will be omitted unless otherwise stated.

7.1 Configuration

In the EUV light condenser mirror 23 of Embodiment 7, the protective layer 63 is configured to have layer thickness distribution in which the layer thickness of the protective layer 63 from the reflective layer surface 62F changes, which is a difference from the comparative example in which the layer thickness is constant.

Figure 19:
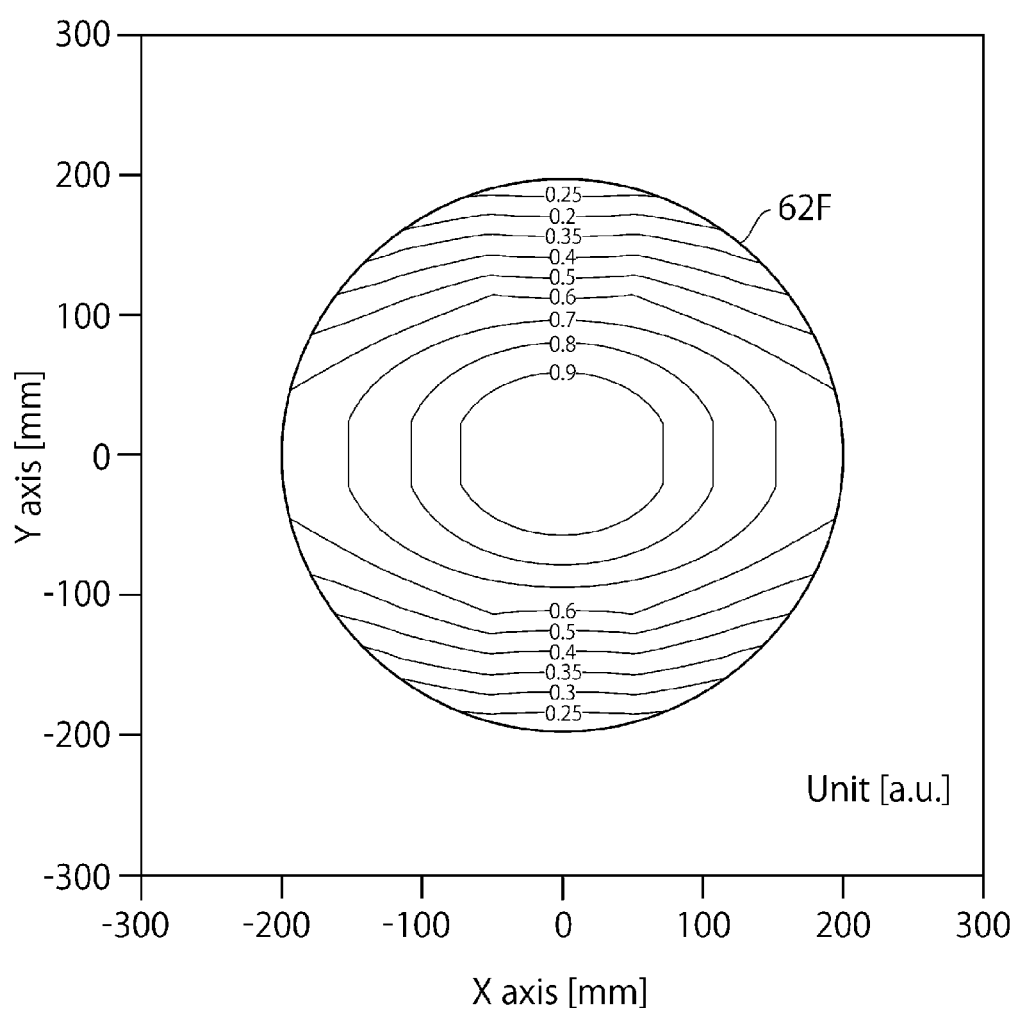
FIG. 19 is a diagram illustrating third combination distribution.
Figure 20:
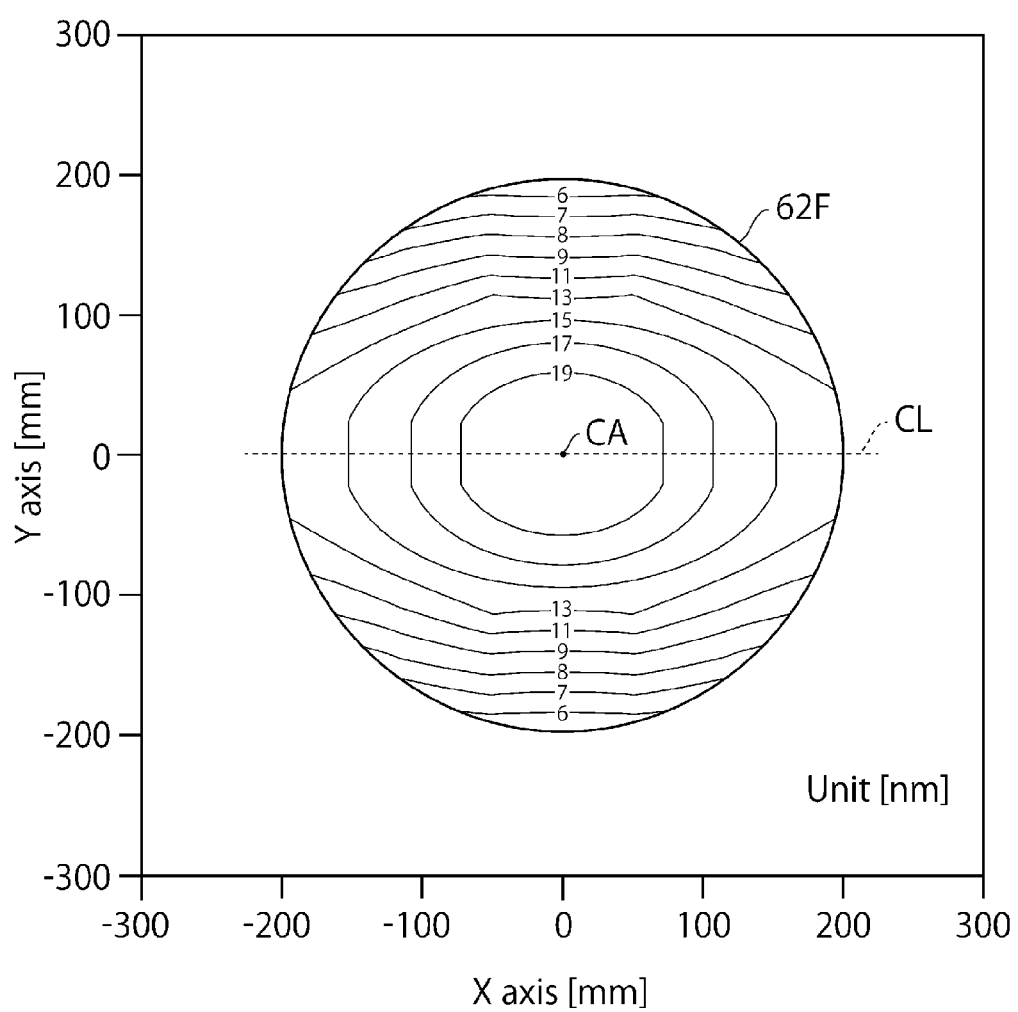
FIG. 20 is a diagram illustrating the layer thickness distribution of the protective layer based on the third combination distribution illustrated in FIG. 19.

FIG. 19 is a diagram illustrating third combination distribution. FIG. 20 is a diagram illustrating the layer thickness distribution of the protective layer based on the third combination distribution illustrated in FIG. 19. FIGS. 19 and 20 each illustrate a plan view when a projection plane orthogonal to the central axis CA of the EUV light condenser mirror 23 is placed between the reflective layer surface 62F having a spheroid shape and the plasma point and the reflective layer surface 62F is projected in parallel onto the projection plane with the plasma point as a viewpoint.

Each numerical value on the reflective layer surface 62F in FIG. 19 is a layer thickness distribution coefficient acquired by Expression (5) below with the first distance D1 illustrated in FIG. 4, the magnetic flux density illustrated in FIG. 6, the second distance D2 illustrated in FIG. 9, and the charged particle quantity illustrated in FIG. 13. However, the layer thickness distribution coefficient may be obtained by a statistical method other than Expression (5).

[Expression 5]

$$R = a\left(\frac{L - L_{max}}{L_{min} - L_{max}}\right) + b\left(\frac{B - B_{min}}{B_{max} - B_{min}}\right) + c\left(\frac{P - P_{max}}{P_{min} - P_{max}}\right) + d\left(\frac{I - I_{max}}{I_{min} - I_{max}}\right) \quad (5)$$

In the Expression (5), I is the charged particle quantity at a target position on the reflective layer surface 62F, and is a variable since a plurality of target positions are optionally selected as described above. In the Expression (5), $I_{min}$ is the minimum value of the charged particle quantity, $B_{max}$ is the maximum value of the charged particle quantity, and d is a weight coefficient allocated to the charged particle quantity. Numbers in the Expression (5) other than these numbers are the same as those in Expressions (1) and (3) above, respectively. In the present embodiment, according to the Expression (5), the ratio of the first distance D1 from the target position relative to the change range of the first distance D1 is calculated and multiplied by the weight coefficient a corresponding to the first distance D1. In addition, the ratio of the magnetic flux density at the target position relative to the change range of the magnetic flux density is calculated and multiplied by the weight coefficient b corresponding to the magnetic flux density. In addition, the ratio of the second distance D2 from the target position relative to the change range of the second distance D2 is calculated and multiplied by the weight coefficient c corresponding to the second distance D2. In addition, the ratio of the charged particle quantity at the target position relative to the change range of the charged particle quantity is calculated and multiplied by the weight coefficient d corresponding to the charged particle quantity. Then, a value obtained by summing results of the multiplication is set as the layer thickness distribution coefficient R.

The weight coefficient c allocated to the second distance D2 may be changed between a case of Embodiment 5 or 6 in which the charged particle quantity on the reflective layer surface 62F is not included and a case of the present embodiment in which this charged particle quantity is included. For example, in the case of Embodiment 5 or 6, as described above, the weight coefficient c allocated to the second distance D2 is set to be larger than the weight coefficient a allocated to the first distance D1 and the weight coefficient b allocated to the magnetic flux density. However, in the present embodiment, the weight coefficient c allocated to the second distance D2 is set to be smaller than the weight coefficient a allocated to the first distance D1 and the weight coefficient b allocated to the magnetic flux density. The weight coefficient d allocated to the charged particle quantity on the reflective layer surface 62F is set to be largest.

Each numerical value on the reflective layer surface 62F in FIG. 20 is obtained by converting the corresponding layer thickness distribution coefficient on the reflective layer surface 62F in FIG. 19 into the layer thickness of the protective layer 63. For example, the layer thickness distribution coefficient R acquired by Expression (5) is converted into the layer thickness of the protective layer 63 by Expression (6) below. However, the layer thickness distribution coefficient may be converted into the layer thickness of the protective layer 63 by a statistical method other than Expression (6).

[Expression 6]

$$T = \frac{R}{(a+b+c+d)} \quad (6)$$

In the Expression (6), T is the layer thickness of the protective layer 63. In the Expression (6), R, a, b, c, and d are the same as those in Expression (5) above, respectively. The difference between the maximum layer thickness and the minimum layer thickness in the present embodiment is 15 nm but may be other than 15 nm. However, the difference between the maximum layer thickness and the minimum layer thickness of the protective layer 63 is preferably equal to or longer than 10 nm.

As illustrated in FIGS. 19 and 20, the layer thickness distribution of the protective layer 63 in the present embodiment is defined based on the first distance D1, the magnetic flux density of the reflective layer surface 62F, the second distance D2, and the charged particle quantity on the reflective layer surface 62F. In the layer thickness distribution of the protective layer 63, the layer thickness is larger at a position at which the layer thickness distribution coefficient obtained by Expression (5) above is larger. The layer thickness distribution of the protective layer 63 is plane symmetric with respect to the plane passing through the magnetic field axis MA of the magnetic field generation unit 4 and the central axis CA of the EUV light condenser mirror 23. As illustrated in FIG. 20, the layer thickness distribution of the protective layer 63 is line symmetric with respect to the central line CL of the reflective layer surface 62F when the reflective layer surface 62F is projected in parallel with the plasma point as a viewpoint. In addition, when the EUV light condenser mirror 23 is provided with the through-hole 23B, the layer thickness distribution of the protective layer 63 is point symmetric with respect to the point at which the opening plane of the through-hole 23B on the reflective layer surface 62F side intersects the central axis CA of the EUV light condenser mirror 23. When the EUV light condenser mirror 23 is not provided with the through-hole 23B, the layer thickness distribution of the protective layer 63 is point symmetric with respect to the point at which the central axis CA of the EUV light condenser mirror 23 intersects the reflective layer surface 62F. The layer thickness of the protective layer 63 is maximum at a position on the central line CL of the reflective layer surface 62F. When the EUV light condenser mirror 23 is provided with the through-hole 23B, the layer thickness of the protective layer 63 is maximum at a position nearest to the central axis CA of the EUV light condenser mirror 23. When the EUV light condenser mirror 23 is not provided with the through-hole 23B, the layer thickness of the protective layer 63 is maximum at a position on the central axis CA of the EUV light condenser mirror 23. The layer thickness of the protective layer 63 is minimum at a position at a site most apart from the central axis CA of the EUV light condenser mirror 23.

The method of manufacturing the protective layer 63 thus configured may be selected from among the three manufacturing methods described in Embodiment 1. However, a manufacturing method other than the three manufacturing methods described in Embodiment 1 may be employed.

10.2 Effect

The layer thickness distribution of the protective layer 63 in the present embodiment is defined based on the first distance D1, the magnetic flux density, the second distance D2, and the charged particle quantity. Accordingly, the tendency of collision of charged particles and fine particles with the reflective layer surface 62F can be easily reflected in detail as compared to when the layer thickness distribution of the protective layer 63 is defined based on three or less of the first distance D1, the magnetic flux density, the second distance D2, and the charged particle quantity. Thus, according to the present embodiment, contamination of the reflective layer 62 being exposed from the protective layer 63 can be further reduced.

Two or more items may be selected from among the four items of the first distance D1, the magnetic flux density, the second distance D2, and the charged particle quantity, and the layer thickness distribution may be defined based on the selected two or more items.

In this case, the ratios of the maximum and minimum values relative to the change range are calculated for each of the selected two or more items and multiplied by weight coefficients corresponding to the item, and a value obtained by summing results of the multiplication is converted into the layer thickness. For example, when the first distance D1, the magnetic flux density, and the second distance D2 are selected, the ratio of the first distance D1 from a target position relative to the change range of the first distance D1 is calculated and multiplied by the weight coefficient a corresponding to the first distance D1 as described above. In addition, the ratio of the magnetic flux density at the target position relative to the change range of the magnetic flux density is calculated and multiplied by the weight coefficient b corresponding to the magnetic flux density as described above. In addition, the ratio of the second distance D2 from the target position relative to the change range of the second distance D2 is calculated and multiplied by the weight coefficient c corresponding to the second distance D2 as described above. Then, a value obtained by summing results of the multiplication is converted into the layer thickness. The conversion may employ Expression (2), (4), or (6) described above or may employ another expression.

However, as described above, when the charged particle quantity is included in the selected two or more items, the weight coefficient d allocated to the charged particle quantity is preferably set to be smaller than the weight coefficient a allocated to the first distance D1 and the weight coefficient b allocated to the magnetic flux density. When the charged particle quantity is not included in the selected two or more items, the weight coefficient d allocated to the charged particle quantity is preferably set to be larger than the weight coefficient a allocated to the first distance D1 and the weight coefficient b allocated to the magnetic flux density.

The above description is intended to provide not restriction but examples. Thus, the skilled person in the art would clearly understand that the embodiments of the present disclosure may be changed without departing from the scope of the claims.

The terms used throughout the specification and the appended claims should be interpreted as "non-limiting". For example, the term "comprising" or "comprised" should be interpreted as "not limited to what has been described as being comprised". The term "having" should be interpreted as "not limited to what has been described as having". It should be understood that the indefinite article "a" in the present specification and the claims means "at least one" or "one or more".

What is claimed is:

1. An extreme ultraviolet light generation apparatus comprising:
   a chamber in which a laser beam is condensed to an internal space and plasma is generated from a target substance at a condensation position of the laser beam;
   a condenser mirror configured to condense extreme ultraviolet light generated by the plasma of the target substance; and
   a magnetic field generation unit configured to generate a magnetic field that converges a charged particle generated by the plasma of the target substance toward a wall of the chamber,
   the condenser mirror including a substrate, a reflective layer provided on the substrate and configured to reflect the extreme ultraviolet light, and a protective layer provided on the reflective layer,
   the protective layer having layer thickness distribution in which a layer thickness of the protective layer from a reflective layer surface changes,
   the layer thickness of the protective layer being maximum at a position on a line on which a plane passing through a magnetic field axis of the magnetic field generation unit and a central axis of the condenser mirror intersects the reflective layer surface.

2. The extreme ultraviolet light generation apparatus according to claim 1, wherein the layer thickness of the protective layer is maximum at a position at a site of the line on the magnetic field generation unit side of the central axis.

3. The extreme ultraviolet light generation apparatus according to claim 1, wherein the layer thickness of the protective layer is minimum at a position at a site most apart from the line.

4. The extreme ultraviolet light generation apparatus according to claim 1, wherein, in the layer thickness distribution, the layer thickness is larger at a position at which the distance between the magnetic field axis and the reflective layer surface is shorter.

5. The extreme ultraviolet light generation apparatus according to claim 1, wherein, in the layer thickness distribution, the layer thickness is larger at a position at which a magnetic flux density on the reflective layer surface is higher.

6. The extreme ultraviolet light generation apparatus according to claim 1, wherein the layer thickness of the protective layer is maximum at a position nearest to the central axis.

7. The extreme ultraviolet light generation apparatus according to claim 1, wherein the layer thickness of the protective layer is minimum at a position at a site most apart from the central axis.

8. The extreme ultraviolet light generation apparatus according to claim 1, wherein, in the layer thickness distribution, the layer thickness is larger at a position at which the distance between the condensation position of the laser beam and the reflective layer surface is shorter.

9. The extreme ultraviolet light generation apparatus according to claim 1, wherein
   the condenser mirror is provided with a through-hole penetrating along the central axis, and
   the laser beam is condensed to the condensation position through the through-hole.

10. The extreme ultraviolet light generation apparatus according to claim 1, wherein, in the layer thickness distribution, the layer thickness is larger at a position at which the number of the charged particles is larger on the reflective layer surface.

11. The extreme ultraviolet light generation apparatus according to claim 1, wherein two or more items are selected from among four items of a first distance between the magnetic field axis and the reflective layer surface, the magnetic flux density of the magnetic field on the reflective layer surface, a second distance between the condensation position of the laser beam and the reflective layer surface, and the number of the charged particles on the reflective layer surface, and the layer thickness distribution is defined based on the selected two or more items.

12. The extreme ultraviolet light generation apparatus according to claim 11, wherein
   weight coefficients different from each other are allocated to the four items, and
   the ratios of a maximum value and a minimum value of each of the selected two or more items relative to a change range are calculated, each ratio is multiplied by the weight coefficient corresponding to the item, and a value obtained by summing results of the multiplication is converted into the layer thickness.

13. The extreme ultraviolet light generation apparatus according to claim 12, wherein the weight coefficient allocated to the first distance is larger than the weight coefficient allocated to the magnetic flux density and is smaller than the weight coefficient allocated to the number of the charged particles.

14. The extreme ultraviolet light generation apparatus according to claim 1, wherein the layer thickness distribution is plane symmetric with respect to the plane.

15. The extreme ultraviolet light generation apparatus according to claim 1, wherein the layer thickness distribution is point symmetric with respect to a point at which the reflective layer surface intersects the central axis.

16. The extreme ultraviolet light generation apparatus according to claim 1, wherein
   the condenser mirror is provided with a through-hole penetrating along the central axis, and
   the layer thickness distribution is point symmetric with respect to a point at which an opening plane of the through-hole on the reflective layer surface side intersects the central axis.

17. The extreme ultraviolet light generation apparatus according to claim 1, wherein the reflective layer has a reflective surface having a spheroid shape, and a rotational axis of the reflective surface is the central axis of the condenser mirror.

18. The extreme ultraviolet light generation apparatus according to claim 1, wherein the magnetic field generation unit includes a pair of coils, and a straight line passing through a coil axis of each coil is the magnetic field axis of the magnetic field generation unit.

* * * * *